(12) United States Patent
Liu et al.

(10) Patent No.: US 11,744,029 B2
(45) Date of Patent: Aug. 29, 2023

(54) ELECTRONIC DEVICE WITH RETRACTABLE SCREEN

(71) Applicant: BEIJING XIAOMI MOBILE SOFTWARE CO., LTD., Beijing (CN)

(72) Inventors: Zhenhua Liu, Beijing (CN); Pengfei Li, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 21 days.

(21) Appl. No.: 17/557,314

(22) Filed: Dec. 21, 2021

(65) Prior Publication Data

US 2022/0418124 A1 Dec. 29, 2022

(30) Foreign Application Priority Data

Jun. 25, 2021 (CN) .......................... 202110713495.2

(51) Int. Cl.
*H05K 5/00* (2006.01)
*H05K 5/02* (2006.01)

(52) U.S. Cl.
CPC ......... *H05K 5/0217* (2013.01); *H05K 5/0017* (2013.01)

(58) Field of Classification Search
USPC ....... 361/807, 727, 728, 752, 796, 800, 809, 361/810
See application file for complete search history.

(56) References Cited

U.S. PATENT DOCUMENTS

| 10,904,371 | B1* | 1/2021 | Song ..................... G06F 1/1656 |
| 10,955,876 | B1 | 3/2021 | Song et al. |
| 2020/0267246 | A1* | 8/2020 | Song ................... H04M 1/0268 |
| 2020/0329572 | A1* | 10/2020 | Wittenberg ........... G06F 1/1652 |

FOREIGN PATENT DOCUMENTS

| CN | 112947688 A | 6/2021 |
| KR | 20170116551 A | 10/2017 |
| WO | WO 2021025198 A1 | 2/2021 |
| WO | WO 2021073475 A1 | 4/2021 |

OTHER PUBLICATIONS

European Patent Application No. 21218253.9, Search and Opinion dated Jun. 10, 2022, 8 pages.
Japanese Patent Application No. 2021-211327, Office Action dated Feb. 7, 2023, 6 pages.
Japanese Patent Application No. 2021-211327, English translation of Office Action dated Feb. 7, 2023, 6 pages.

* cited by examiner

*Primary Examiner* — Hung S. Bui
(74) *Attorney, Agent, or Firm* — Cozen O'Connor

(57) ABSTRACT

An electronic device includes a first housing provided with a first sliding portion and a second housing slidably arranged on the first housing along a first direction, the first housing and the second housing being enclosed to form a receiving structure with an opening; a flexible display screen having a first end arranged at a side close to a bottom of the housing and a second end connected to the first housing to cover the opening; and a sliding rail mechanism including a bracket connected to the flexible display screen and provided with a second sliding portion matching the first sliding portion, the first sliding portion being one of a sliding rail and a sliding groove, the second sliding portion being the other. The sliding rail moves along the sliding groove to drive the flexible display screen to slide along the first direction relative to the first housing.

20 Claims, 15 Drawing Sheets

ELECTRONIC DEVICE WITH RETRACTABLE SCREEN

CROSS-REFERENCE TO RELATED APPLICATION

This application claims priority to and benefits of Chinese Patent Application Serial No. 202110713495.2, filed on Jun. 25, 2021, the entire content of which is incorporated herein by reference.

BACKGROUND

With the continuous advancement of screen technology, including large-scale production of foldable flexible screens, and the creation of 0.01 mm thick flexible display screens, the form of terminal products is becoming more and more diverse. From smart wearables to smart homes to smart phone terminals, ultra-thin flexible screens will cause multi-directional designs for future products, such as foldable mobile phones, ring mobile phones, specially curved terminal products, and the like. In the meanwhile, the advent of 5G will allow all smart products to be electrically connected and quantity of data transmitted between smart products will be accelerated. In this way, some modules of smart terminal products, such as camera modules, BOX acoustic modules, and the like, can be separated from smart terminal products and while still achieving their functions. With the further development of battery technology, the size of the terminal product can be smaller, the battery capacity can be higher, and the design form of the terminal product can be more flexible.

With growing interest in flexible screen products, especially when dealing with different tasks such as watching videos and making phone calls, user experience is improved when the display area may be increased or decreased depending on the user's activity. Currently, there are mainly two screen expansion structures: foldable screen structure and retractable screen structure.

SUMMARY

The present disclosure relates to the field of retractable screen products, and in particular, to an electronic device with a retractable screen.

An embodiment of the present disclosure provides an electronic device, including: a first housing and a second housing slidably arranged on the first housing along a first direction, the first housing and the second housing being enclosed to form a receiving structure with an opening, the first housing being provided with a first sliding portion arranged along the first direction; a flexible display screen having a first end located at a side close to a bottom of the housing and a second end connected to the first housing to cover the opening; and a sliding rail mechanism including a bracket connected to the flexible display screen, the bracket being provided with a second sliding portion matching the first sliding portion, the first sliding portion being one of a sliding rail and a sliding groove, the second sliding portion being the other of the sliding rail and the sliding groove; the sliding rail moving along the sliding groove such that the sliding rail mechanism drives the flexible display screen to slide along the first direction relative to the first housing.

BRIEF DESCRIPTION OF THE DRAWINGS

The drawings here are incorporated into the description and constitute a part of the description. The drawings show embodiments that conform to the present disclosure, and are used together with the description to explain the principle of the present disclosure.

DETAILED DESCRIPTION

Figure 1:
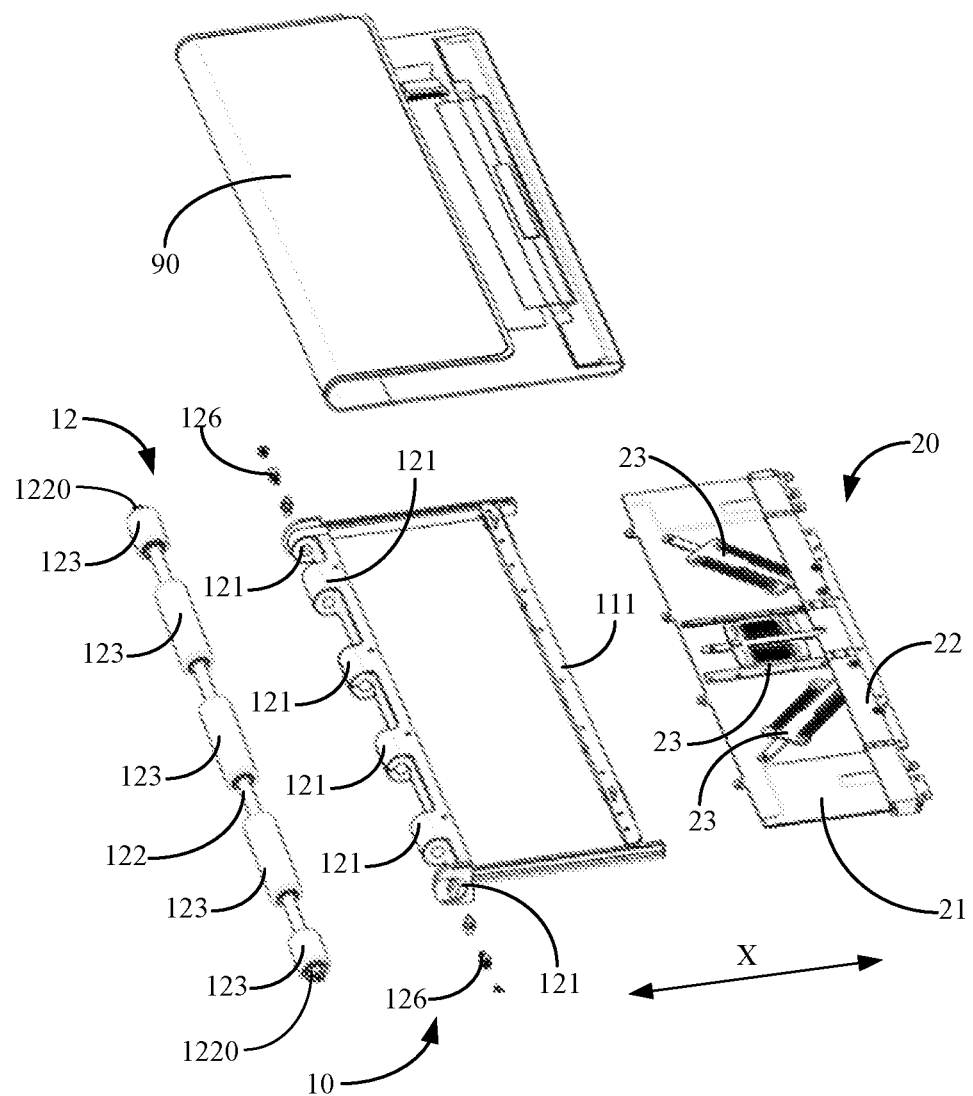
FIG. 1 is an exploded diagram of a retractable screen structure according to an embodiment of the present disclosure.
Figure 2:
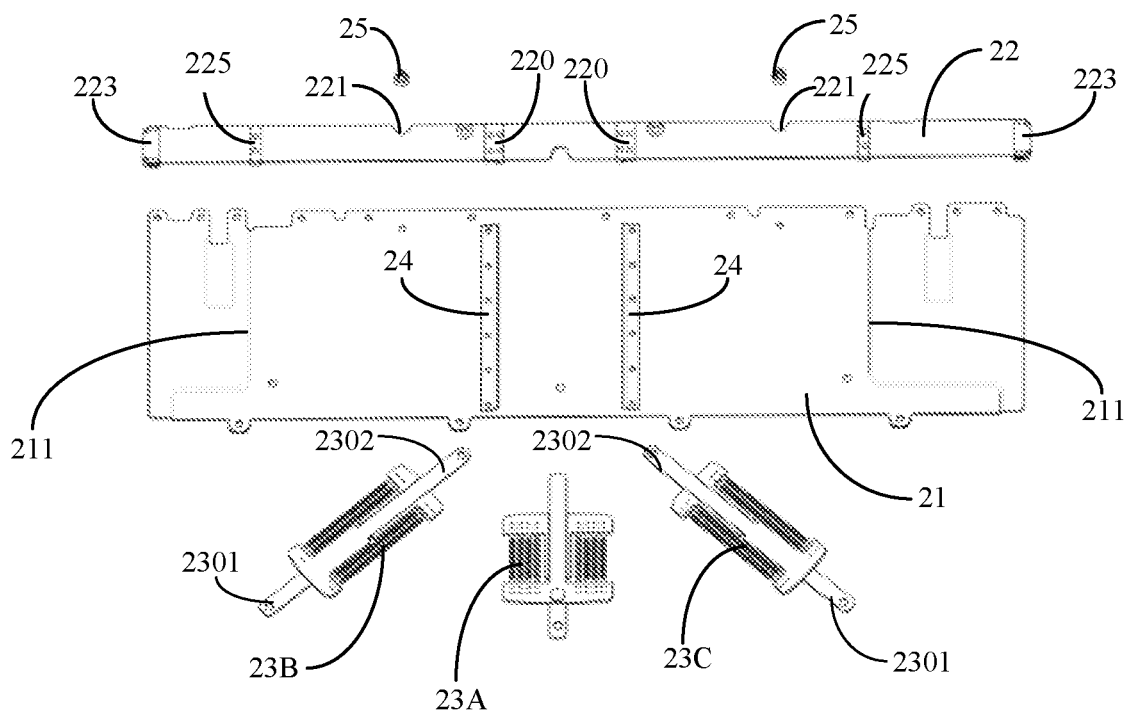
FIG. 2 is a schematic exploded diagram of a sliding rail assembly of a sliding rail mechanism according to an embodiment of the present disclosure.

Exemplary embodiments will be described in detail herein, examples of which are illustrated in accompanying drawings. When the following description refers to accompanying drawings, same numerals in different accompanying drawings refer to the same or similar elements, unless otherwise indicated. The implementations described in the following exemplary embodiments do not represent all embodiments consistent with the present disclosure. Instead, they are merely examples of devices and methods consistent with some aspects, as detailed in the appended claims, of the present disclosure.

The terminology used in the present disclosure is for the purpose of describing specific embodiments, but not intended to limit the present disclosure. Unless otherwise defined, the technical terms or scientific terms used in the present disclosure shall have the usual meanings understood by those of ordinary skills in the field to which the present disclosure belongs. Words, such as "first", "second", and the like used in the specification and claims of the present disclosure do not denote any sequence, quantity, or importance, but are merely for distinguishing different components. Similarly, the word such as "one", "an" or the like does not mean a quantity limit, but means "at least one". "a plurality of" or "several" means two or more. Unless otherwise indicated, words such as "front", "rear", "lower" and/or "upper", and the like are only for convenience of description, and do not mean limitation to one position or one spatial orientation. The word, such as "including", "comprising" or the like, means that a component or item prior to the word "including" or "comprising" encompasses any component or item listed behind the word or its equivalent, and does not exclude other components or items. "coupled" or "connected" and other similar words are not limited to physical or mechanical connections, but may include electrical connections, whether direct or indirect.

The terminology used in the present disclosure is for the purpose of describing specific embodiments, but not intended to limit the present disclosure. The singular forms "a", "said" and "the" as used in the present disclosure and the appended claims are also intended to include plural forms unless other meanings are otherwise explicitly indicated in the context. It also should be understood that the term "and/or" as used herein refers to encompassing any or all possible combinations of one or more associated listed items.

The present disclosure provides a driving mechanism and an electronic device. The sliding rail mechanism and the electronic device of the present disclosure will be described in detail below with reference to the accompanying drawings. In the case of no conflict, the features in the following embodiments and implementations may be combined with each other.

Referring to FIGS. 1 to 4, an embodiment of the present disclosure provides an electronic device 100, which may be a mobile phone, a mobile terminal, a tablet computer, a laptop, a handheld terminal device with a screen, a vehicle-mounted display device, and the like. The electronic device 100 may include a housing, a flexible display screen 90, a sliding rail mechanism 1, a rotating shaft assembly, and a driving mechanism 99.

The sliding rail mechanism 1 includes a bracket 11 and a sliding rail assembly 20. The sliding rail assembly 20 includes a fixed base 21, a sliding member 22 configured to connect a flexible display screen 90 of a retractable screen structure, and an elastic assembly 23. The fixed base 21 is fixedly connected to the bracket 11, the sliding member 22 is slidably arranged on the fixed base 21 in a first direction X (a vertical direction illustrated in FIG. 3), a first end 2301 of the elastic assembly 23 is connected to the fixed base 21, and a second end 2302 of the elastic assembly 23 is connected to the sliding member 22. When the sliding member 22 slides along the first direction X relative to the fixed base 21, the second end of the elastic assembly 23 and the flexible display screen 90 are driven to move together. The elastic assembly 23 is stretched or compressed under the drive of the sliding member 22 to generate deformation, thereby generating a pre-tension on the flexible display screen 90. It can be understood that the sliding member 22 slides relative to the fixed base 21 along a direction indicated by an arrow in FIG. 3, and then the elastic assembly 23 is stretched to generate a reverse tension force.

Through the above arrangement, the sliding member 22 moves along the first direction X relative to the fixed base 21, and then the flexible display screen 90 of the retractable screen structure can be driven to move together, thereby realizing the expanding and retracting of the flexible display screen 90. The sliding member 22 drives the elastic member 23 to move together, and the elastic member 23 is stretched to generate a pre-tension on the flexible display screen 90 such that the flexible display screen 90 becomes flatter when expanded, thereby preventing visual problems such as bulging, swelling and distortion of the screen when the whole device is slid open.

In some possible implementations, the sliding rail assembly 20 further includes at least one guide rail 24, the guide rail 24 is arranged on the fixed base 21 and extends along the first direction X, the sliding member 22 is provided with a sliding groove 220 corresponding to the guide rail 24, and the sliding member 22 is slidably arranged on the guide rail 24 through the sliding groove 220. In the present embodiment, two sets of guide rails 24 are provided and symmetrically arranged on the fixed base 21, such that the sliding member 22 can slide more stably. In other examples, there may also be other numbers of guide rails 24, which is not limited in the present disclosure.

Figure 3:
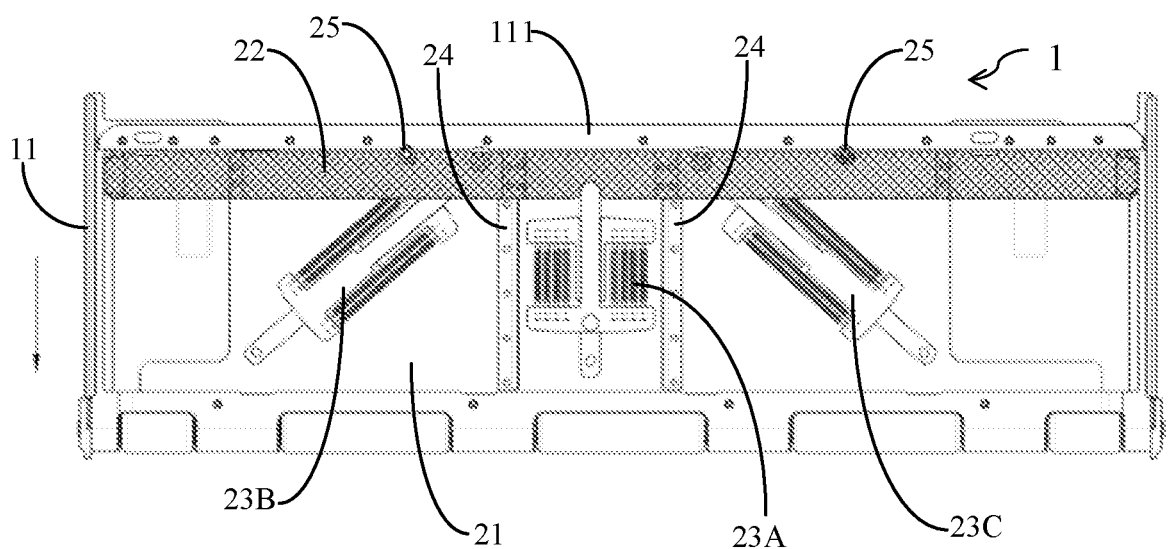
FIG. 3 is a schematic structural diagram of a sliding rail mechanism according to an embodiment of the present disclosure.

In some possible implementations, the sliding rail assembly 20 further includes at least one limit stopper 25, arranged at an end of the fixed base 21 away from the bracket 11 (i.e., an upper end in FIG. 3). The sliding member 22 is provided with a limit portion 221 that abuts against and cooperates with the limit stopper 25. The limit stopper 25 abuts against and cooperates with the limit portion 221 of the sliding member 22 to limit an initial position of the sliding member 22 and also prevent the sliding member 22 from separating from the guide rail 24. In the present embodiment, the limit portion 221 can be understood as a groove, two limit stoppers 25 are provided and symmetrically arranged on the fixed base 21, two limit portions 221 are provided and correspond to the limit stoppers 25, and the present disclosure does not limit this. In the example illustrated in FIG. 3, the limit stoppers 25 are arranged at the upper end of the fixed base 21, and an initial position of the sliding member 22 is located at the upper end of the fixed base 21. In this state, the elastic assembly 23 applies an elastic pre-tension on the sliding member 22 to keep the sliding member 22 at the initial position.

Figure 4:
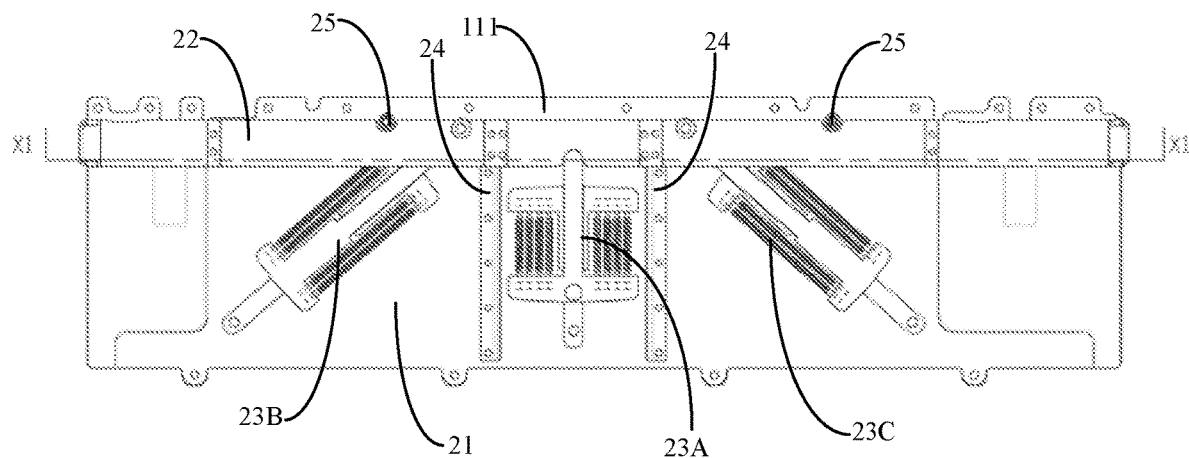
FIG. 4 is a schematic structural diagram of a sliding rail assembly of a sliding rail mechanism according to an embodiment of the present disclosure.
Figure 5:
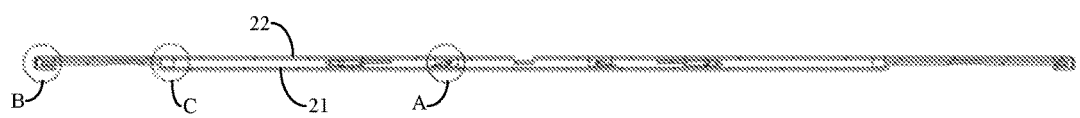
FIG. 5 is a cross-sectional view of FIG. 4 along direction X1-X1.
Figure 6:
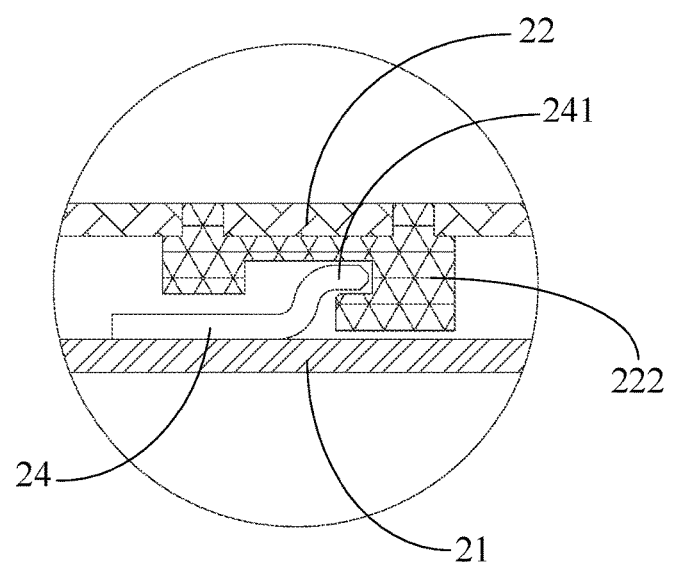
FIG. 6 is a schematic enlarged partial diagram of position A in FIG. 5.

Referring to FIGS. 4 to 6, in some possible implementations, at least one side of the guide rail 24 is provided with an engaging portion 241, and the sliding member 22 is provided with a first snap portion 222 snapped with the engaging portion 241. The sliding member 22 is snapped with the engaging portion 241 of the guide rail 24 through the first snap portion 222, such that the sliding member 22 can be more securely connected to the guide rail 24 and the sliding member 22 can more stably slide along the guide rail 24. It can be understood that the engaging portion 241 may be of an inverted hook structure machined from a sheet metal part to prevent the sliding member 22 from separating from the guide rail 24. In the present embodiment, two sides of the guide rail 24 are each provided with an engaging portion 241, which is not limited in the present disclosure.

Figure 7:
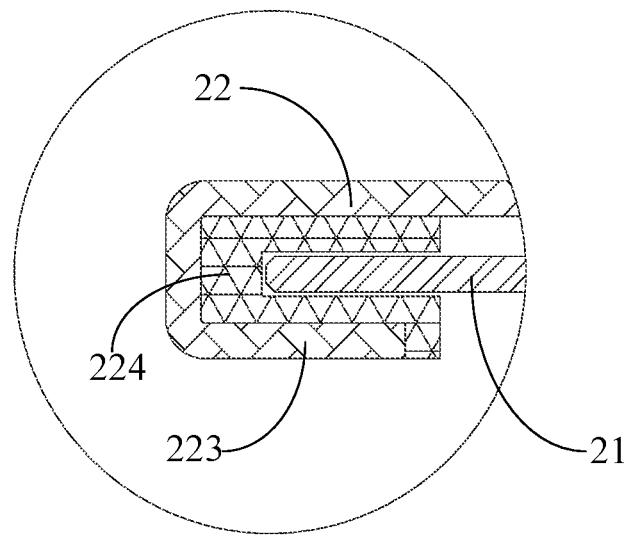
FIG. 7 is a schematic enlarged partial diagram of position B in FIG. 5.

Referring to FIG. 7, in some possible implementations, the side of the sliding member 22 is provided with a second snap portion 223 snapped with a side edge of the fixed base 21. The sliding member 22 is snapped with the side edge of the fixed base 21 through the second snap portion 223 such that the sliding member 22 and the fixed base 21 are connected more stably and the sliding member 22 is prevented from separating from the fixed base 21 when sliding, thus improving the sliding stability of the sliding member 22. Further, the sliding rail assembly 20 further includes a plastic snap 224, covering and locked at the side edge of the fixed base 21, and the second snap portion 223 is snapped with the plastic snap 224. The plastic snap 224 can reduce friction between the second snap portion 223 and the side edge of the fixed base 21, reduce wear and ensure smooth sliding. In the present embodiment, the plastic snap 224 can be made of POM (Polyoxymethylene) plastic which is a self-lubricating plastic. The sliding member 22 and the plastic snap 224 can be combined as one part by an insert-molding process. A design gap between the plastic snap 224 and the side edge of the fixed base 21 is 0.05 to ensure that the sliding member 22 can only slide along the extending direction of the guide rail 24, i.e., the first direction X, thus improving the structural stability.

Figure 8:
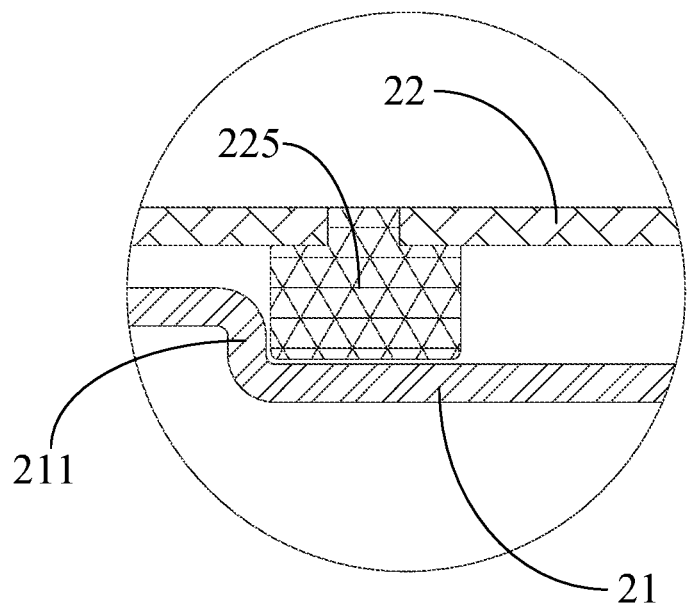
FIG. 8 is a schematic enlarged partial diagram of position C in FIG. 5.

Referring to FIG. 8, in some possible implementations, the fixed base 21 is provided with a step portion 211 extending along the first direction X, and the sliding member 22 is provided with an abutting block 225 abutting against the step portion 211; by cooperation of the abutting block 225 and the step portion 211, the sliding member 22 can be further prevented from separating from the fixed base 21 when sliding.

Figure 9:
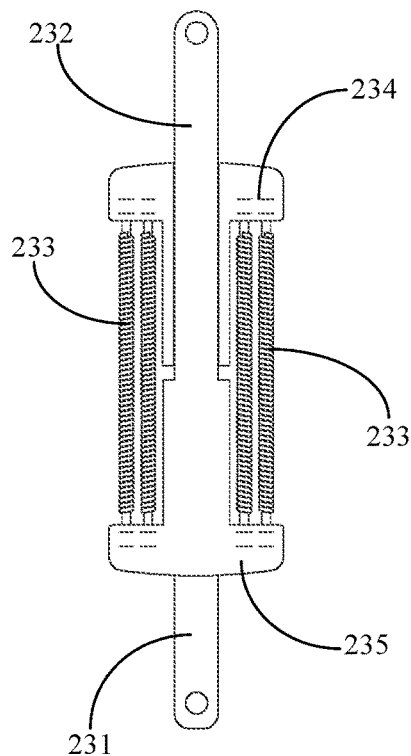
FIG. 9 is a schematic structural diagram of an elastic assembly of a sliding rail mechanism according to an embodiment of the present disclosure.

Referring to FIG. 9, in some possible implementations, the elastic assembly 23 includes a first rod 231, a second rod 232, and an elastic member 233. The first rod 231 and the second rod 232 are inserted into each other and can slide relative to each other, and the elastic member 233 is connected between the first rod 231 and the second rod 232. The first rod 231 is connected to the fixed base 21, and the second rod 232 is connected to the sliding member 22. The elastic member 233 may be configured as a spring, a tension spring, or the like, and has a pre-tension during assembly to keep the sliding member 22 at the initial position. When the first rod 231 and the second rod 232 are stretched, the spring starts to work. When the sliding member 22 slides relative to the fixed base 21, the second rod 232 is driven to slide relative to the first rod 231 and cooperates with the first rod 231 to stretch or compress the elastic member 233 such that the elastic member 233 is deformed to generate an elastic force on the sliding member 22.

Further, the first rod 231 and the second rod 232 are each provided with a sliding groove, and they are inserted into each other and can slide relatively. A first end (a lower end illustrated in FIG. 9) of the first rod 231 is fixed to the fixed base 21 by a rivet, and a first end (an upper end illustrated in FIG. 9) of the second rod 232 is fixed to the sliding member 22 by a rivet, a second end of the first rod 231 protrudes outward to form a first protrusion 234, and a second end of the second rod 232 protrudes outward to form a second protrusion 235; a plurality of elastic members 233 are provided and evenly arranged between the first protrusion 234 and the second protrusion 235, which can provide sufficient elastic force. When the sliding member 22 slides relative to the fixed base 21, the second rod 232 is driven to slide relative to the first rod 231 and cooperates with the first rod 231 to stretch the elastic member 233 such that the elastic member 233 is deformed to generate a reverse tension on the sliding member 22, thus ensuring that the flexible display screen is in a "tightened" state.

In some possible implementations, a plurality of elastic assemblies 23 are provided, including a first elastic assembly 23A, a second elastic assembly 23B, and a third elastic assembly 23C. The second elastic assembly 23B and the third elastic assembly 23C are symmetrically arranged at two sides of the first elastic assembly 23A. The elastic member 233 of the first elastic assembly 23A extends along the first direction X, and the elastic members 233 of the second elastic assembly 23B and the third elastic assembly 23C are symmetrically arranged along the first direction X and inclined with respect to the first direction X.

Due to limited space, it is difficult for a single guide rail to achieve such a large elastic stroke. Based on the above arrangement, the three elastic assemblies can form a relay form to improve a sliding stroke of the elastic assemblies. The second elastic assembly 23B and the third elastic assembly 23C are of the same design and are arranged symmetrically at two sides of the elastic assembly 23A. An initial compression amount of the elastic member of the first elastic assembly 23A may be slightly greater than the initial compression amounts of the elastic members of the second elastic assembly 23B and the third elastic assembly 23C, thereby achieving a greater sliding stroke. Assuming that the designed total sliding stroke is 30.00 mm, the first elastic assembly 23A can start working after the sliding member 22 slides by 19 mm.

In some possible embodiments, the entire sliding rail assembly 20 may be fixed to the bracket 11 by riveting. An end of the bracket 11 may include a connecting plate 111, and the fixed base 21 may be a stamped metal plate and fixed to the connecting plate 111 by a riveting process. The flexible display screen 90 is fixed to the sliding member 22 of the sliding rail assembly 20. The bracket 11 can be made of an aluminum alloy to improve the structural strength. The sliding member 22 can be machined from an SUS stainless steel plate and a POM plastic by the insert-molding process. The stainless steel plate can serve as a body to play the role of strength support. The sliding groove can be made of the POM plastic by injection-molding and can slide relative to the fixed base 21 and the guide rail 24 to reduce friction. The limit stopper 25 can be made of a plastic material and can limit the initial position of the sliding member 22 and also prevent the sliding member 22 from separating from the guide rail 24. The guide rail 24 can be machined from stainless steel by a stamping process and fixed to the fixed base 21 by spot welding. The guide rail 24 cooperates with the sliding groove 220 in the sliding member 22 to form an inverted hook structure to prevent the sliding member 22 from separating from the guide rail 24 when sliding. An exposed surface of the sliding member 22 can serve as an adhesive area 226 to be adhered and fixed to the flexible display screen 90.

Figure 10:
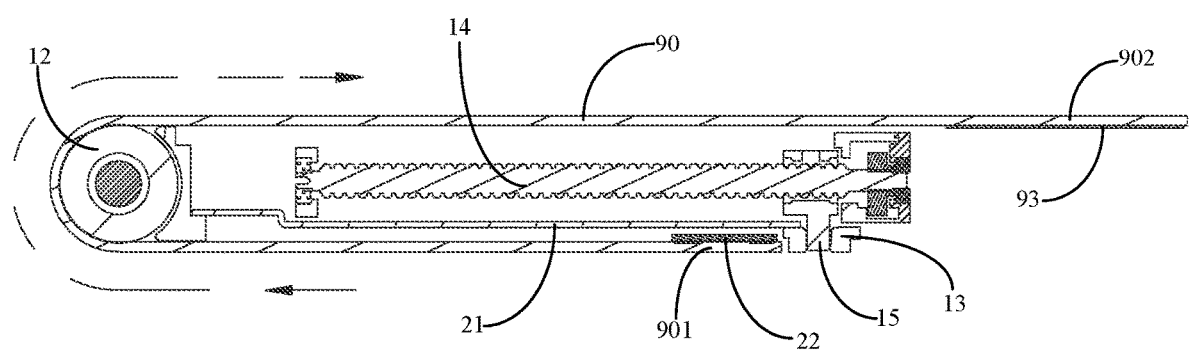
FIG. 10 is a schematic structural diagram of a retractable screen structure according to an embodiment of the present disclosure.

Referring to FIGS. 1 and 10, an embodiment of the present disclosure provides a retractable screen structure, including the sliding rail mechanism 1 described in the above embodiment and the flexible display screen 90. The rotating shaft assembly 12 is arranged at a side of the bracket 11 away from the sliding rail assembly 20, and an axial direction of the rotating shaft assembly 12 is perpendicular to the first direction X. A first end of the flexible display screen 90 is connected to the sliding member 22, and a second end of the flexible display screen 90 is wound around the rotating shaft assembly 12.

The rotating shaft assembly 12 includes a rotating shaft support, a rotating shaft 122, and a rotating wheel. The rotating shaft support is connected to a side of the bracket 11 away from the sliding rail assembly 20 and is provided with a shaft hole, and an axial direction of the shaft hole is perpendicular to the first direction X. The rotating shaft 122 passes through the shaft hole, and the rotating wheel is fitted over the rotating shaft 122. The flexible display screen 90 is wound around the rotating wheel, and when the flexible display screen 90 is expanded or retracted, the rotating wheel is driven to rotate. It can be understood that the first end 901 of the flexible display screen 90 is connected to the sliding member 22 of the sliding rail assembly 20, and the second end 902 of the flexible display screen 90 is wound around the rotating wheel. In the present embodiment, the flexible display screen 90 is formed by bonding a flexible OLED screen and a layer of extremely thin stainless steel mesh together and has great flexibility.

Based on the above arrangement, the flexible display screen 90 is wound around the rotating wheel of the rotating shaft assembly 12. When the flexible display screen 90 is expanded or retracted, the rotating wheel is driven to rotate, that is, the rotating wheel rotates passively. The rotating wheel can function as a pulley such that the flexible display screen 90 can be expanded and retracted more smoothly; the friction and energy loss can be effectively reduced during the expanding and retracting process of the flexible display screen 90 such that the flexible display 90 can be expanded or retracted more smoothly.

In some possible implementations, the rotating shaft 122 is fixedly connected to the shaft hole, and the rotating wheel is rotatably connected to the rotating shaft 122. It can be understood that the rotating shaft 122 is fixedly connected to the rotating shaft support, the rotating wheel is rotatable relative to the rotating shaft 122, and the rotating shaft does not rotate relative to the rotating shaft support. When the flexible display screen 90 is expanded or retracted, only the rotating wheel is driven to rotate.

Figure 11:
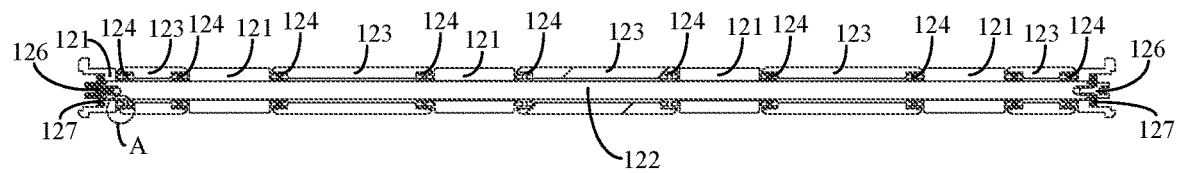
FIG. 11 is a schematic structural diagram of a rotating shaft assembly of a retractable screen structure according to an embodiment of the present disclosure.

Referring to FIGS. 1 and 11, in some possible implementations, the rotating shaft support includes a plurality of sub-supports 121, which are arranged on the bracket 11 and spaced apart along a direction perpendicular to the first direction X; each sub-support 121 is provided with a sub shaft hole; the sub shaft holes of the plurality of sub-supports 121 are coaxially arranged to form the shaft hole, and the rotating shaft 122 passes through the plurality of sub shaft holes so as to be fixedly connected with the plurality of sub-supports 121. The rotating wheel includes a plurality of sub rotating wheels 123, and a sub rotating wheel 123 is arranged between two adjacent sub-supports 121. It can be understood that the rotating shaft support is configured to have a plurality of sub-supports 121, the rotating wheel is configured to have a plurality of sub rotating wheels 123, and the sub-supports 121 and the sub rotating wheels 123 are arranged alternately, which can ensure the rotation performance of the rotating wheel, enhance the strength of the rotating shaft support, and improve the overall structural strength. It can be understood that all the sub-supports 121 of the rotating shaft support are fixedly connected to the bracket 11, and may also be integrally formed with the bracket 11. It should be noted that all the sub-supports 121 can be different in size, for example, can be divided into small supports and large supports; the sub-supports located at both sides are small supports, and the sub-support located in the middle is a large support. All the sub rotating wheels 123 can also be different in size, for example, can be divided into large rotating wheels and small rotating wheels, which can be configured according to actual needs and will not be limited in the present disclosure.

In some possible implementations, the rotating shaft assembly 12 further includes a plurality of first bearings 124 fitted over the rotating shaft 122, and a first bearing 124 is arranged on each of two sides of the sub rotating wheel 123. The first bearing 124 includes an inner bearing ring and an outer bearing ring rotatably connected to the inner bearing ring, the inner bearing ring is connected to the rotating shaft 122, and the outer bearing ring is connected to the sub rotating wheel 123. It can be understood that the sub rotating wheel 123 rotates relative to the rotating shaft 122 through the first bearing 124, and the first bearing 124 can reduce the friction loss caused by the rotation of the sub rotating wheel 123. The inner bearing ring and the rotating shaft 122 may have a zero clearance fit design in a radial direction to ensure that the inner bearing ring will not rotate together with the sub rotating wheel 123. The sub rotating wheel 123 and the rotating shaft 122 may have an avoidance design in the radial direction to ensure that a gap is formed between the sub rotating wheel 123 and the rotating shaft 122 to achieve rotation.

Figure 12:
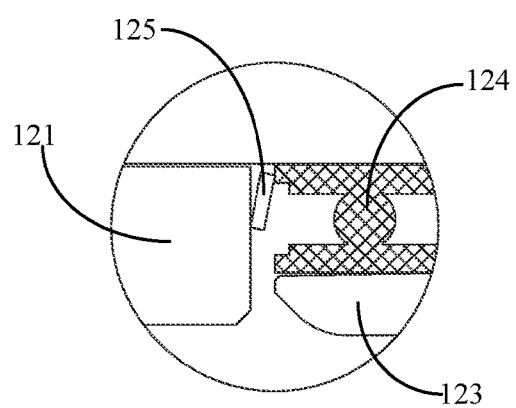
FIG. 12 is an schematic enlarged diagram of position A in FIG. 11.

Referring to FIG. 12, in order to prevent the inner bearing ring from rotating together with the sub rotating wheel 123, that is, to ensure that the inner bearing ring does not rotate relative to the rotating shaft 122, the rotating shaft assembly 12 further includes a plurality of bearing shims 125 fitted over the rotating shaft 122, and each side of the first bearing 124 is provided with a bearing shim 125. An end of the bearing shim 125 abuts against the inner bearing ring, and the other end of the bearing shim 125 abuts against the adjacent sub-support 121. In this way, the inner bearing ring and the adjacent sub-support 121 can be pressed against each other to prevent the inner bearing ring from rotating together with the sub rotating wheel 123, thus ensuring that the inner bearing ring does not rotate relative to the rotating shaft 122. In this way, the rotation of the sub rotating wheel 123 completely relies on the rotation of the outer bearing ring and the friction loss is relatively low.

Optionally, in some possible implementations, the bearing shim 125 is made of copper or stainless steel, with a bowl-like cross section, and has a mechanical property that can be slightly compressed in a thickness direction. A bottom end of the bowl-like structure abuts against the inner bearing ring, and a bowl opening end of the bowl-like structure abuts against the adjacent sub-support 121, thereby compressing the inner bearing ring and the adjacent sub-support 121 to each other.

In some possible implementations, the rotating shaft assembly 12 further includes two sets of first fasteners 126; an end of the rotating shaft 122 is fixedly connected to the rotating shaft support through one set of the first fasteners 126, and the other end of the rotating shaft 122 is fixedly connected to the rotating shaft support through another set of the first fasteners 126. It can be understood that the first fastener 126 passes through the outermost sub-support 121 and is fixedly connected to the end of the rotating shaft 122, thereby fixing the rotating shaft 122 and the rotating shaft support together. Optionally, a gasket 127 is further arranged between the first fastener 126 and the rotating shaft support. The first fastener 126 can be configured as a dual screw, and a gasket 127 is arranged between the first fastener 126 and the outermost sub-support 121 such that the rotating shaft 122 and the rotating shaft support can be connected more firmly. Further, a gap between the sub-support 121 and the inner bearing ring can be set to zero match or slight interference (depending on the material and the sizes of the parts); in this way, a pressure exists between the bearing shim 125 and the inner bearing ring through the locking force of the dual screws at the two ends, and this pressure can ensure that the inner bearing ring does not rotate relative to the rotating shaft 122.

In the present embodiment, the sub rotating wheel 123 can be made of the engineering plastic POM by injection-molding and has a through hole in the middle and grooves at two ends to place the first bearings 124; the sub rotating wheel 123 is fitted over the rotating shaft 122; after assembly, the sub rotating wheel 123 can be rotated passively on the rotating shaft 122 by the first bearings 124. The rotating shaft 122 can be configured as a D-shaped shaft with a D-shaped cross section, and is mainly used to fix the inner bearing ring, thereby preventing the inner bearing ring from rotating relative to the rotating shaft. The rotating shaft 122 which may be made of stainless steel passes through the plurality of sub-supports 121. Threads 1220 may be formed on two ends of the rotating shaft 122 to realize fastening connection with the first fasteners 126 and to be easily fixed to a middle frame of the electronic device 100, thereby fixing the rotating shaft. The first fastener 126 may be made of a metal material and is configured as, for example, a dual screw. The first fastener 126 passes through the gasket 127 and is locked on the rotating shaft 122 to lock the rotating shaft 122 and the rotating shaft support. The first bearing 124 may be made of stainless steel or ceramic, and is assembled on the sub rotating wheel 123. Two ends of each sub rotating wheel 123 are each equipped with a first bearing 124 and also equipped with a bearing shim 125. The bearing shim 125 may be made of a metal material. During mounting of the sub rotating wheels on the rotating shaft, a bearing shim is placed on each of two sides of each rotating wheel, and the rotating shaft passes through the inner holes of the bearing shims; after the two ends of the rotating shaft are locked by the dual screws, the gasket functions to fix the inner bearing ring and prevent the inner bearing ring from rotating with the outer bearing ring, and also ground the first bearing and the bracket.

Figure 13:
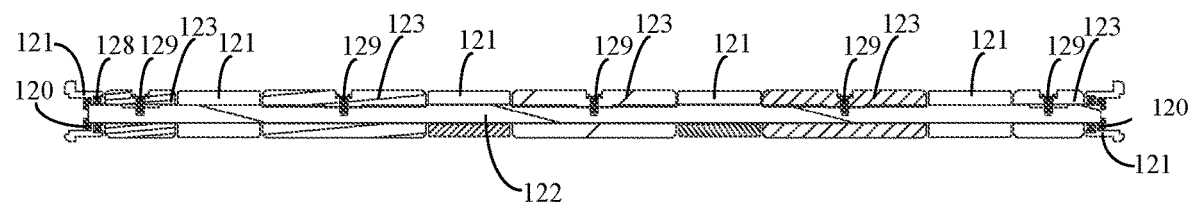
FIG. 13 is a schematic structural diagram of a rotating shaft assembly of a retractable screen structure according to another embodiment of the present disclosure.

Referring to FIGS. 1 and 13, in some possible implementations, the rotating shaft 122 is rotatably connected with the shaft hole, and the rotating wheel is fixedly connected with the rotating shaft 122. It can be understood that the rotating shaft 122 is fixedly connected to the rotating wheel, the rotating wheel does not rotate relative to the rotating shaft 122, and the rotating shaft 122 can rotate relative to the rotating shaft support. When the flexible display screen 90 is expanded or retracted, the rotating wheel and the rotating shaft 122 are driven to rotate together.

In some possible implementations, the rotating shaft support includes a plurality of sub-supports 121, which are arranged on the bracket 11 and spaced apart along a direction perpendicular to the first direction X; each sub-support 121 is provided with a sub shaft hole; the sub shaft holes of the plurality of sub-supports 121 are coaxially arranged to form the shaft hole, and the rotating shaft 122 passes through the plurality of sub shaft holes to be fixedly connected with the plurality of sub-supports 121. The rotating shaft includes a plurality of sub rotating wheels 123, and a sub rotating wheel 123 is arranged between two adjacent sub-supports 121. It can be understood that the rotating shaft support is configured to have a plurality of sub-supports 121, the rotating wheel is configured to have a plurality of sub rotating wheels 123, and the sub-supports 121 and the sub rotating wheels 123 are arranged alternately, which can ensure the rotation performance of the rotating wheel, enhance the strength of the rotating shaft support, and improve the overall structural strength. It can be understood that all the sub-supports 121 of the rotating shaft support are fixedly connected to the bracket 11, and may also be integrally formed with the bracket 11. It should be noted that all the sub-supports 121 can be different in size, for example, can be divided into small supports and large supports; the sub-supports located at both sides are small supports, and the sub-support located in the middle is a large support. All the sub rotating wheels 123 can also be different in size, for example, can be divided into large rotating wheels and small rotating wheels, which can be configured according to actual needs and will not be limited in the present disclosure.

In some possible implementations, the rotating shaft assembly 12 further includes two second bearings 128 which are respectively fitted over two ends of the rotating shaft 122, and the ends of the rotating shaft 122 are rotatably connected with the rotating shaft support through the second bearings 128. The second bearing 128 includes an inner bearing ring and an outer bearing ring rotatably connected to the inner bearing ring, the inner bearing ring is connected to the rotating shaft support, and the outer bearing ring is connected to the rotating shaft 122. It can be understood that the rotating shaft 122 rotates relative to the sub-support 121 of the rotating shaft support through the second bearing 128, and the second bearing 128 can reduce the friction loss caused by the rotation of the rotating shaft 122. The sub rotating wheel 123 and the rotating shaft 122 may have a zero clearance fit design in the radial direction to ensure that the sub rotating wheel 123 rotates as the rotating shaft 122 rotates. The sub-support 121 of the rotating shaft support and the rotating shaft 122 may have an avoidance design in the radial direction to ensure that a gap is formed between the sub-support 121 and the rotating shaft 122 to achieve rotation. In the present embodiment, only two second bearings 128 are needed to realize the rotation of the rotating shaft 122 relative to the rotating shaft support, which reduces the number of bearings and simplifies the model design.

In some possible implementations, the rotating shaft assembly 12 further includes two shaft covers 120; one of the shaft covers 120 abuts against an inner ring of the adjacent rotating shaft 122 from an end of the shaft hole, and the other shaft cover 120 abuts against the inner ring of the adjacent rotating shaft 122 from the other end of the shaft hole; the inner bearing ring is pressed by the shaft covers 120 to limit the rotating shaft 122 in the axial direction, thereby preventing the rotating shaft 122 from being displaced in the axial direction.

In some possible embodiments, the rotating shaft assembly 12 further includes a plurality of second fasteners 129, and the second fasteners 129 pass through the sub rotating wheels 123 and are fixedly connected with the rotating shaft 122. It can be understood that one sub rotating wheel 123 may be fixedly connected to the rotating shaft 122 through a second fastener 129, or may also be fixedly connected to the rotating shaft 122 through a plurality of second fasteners 129, which is not limited in the present disclosure.

Referring to FIGS. 17 to 20, an embodiment of the present disclosure provides an electronic device 100, which may be a mobile phone, a mobile terminal, a tablet computer, a laptop, a handheld terminal device with a screen, a vehicle-mounted display device, and the like. The electronic device 100 includes a housing, a retractable screen structure as described in the above embodiment, and a driving mechanism 99.

The housing includes a first housing 91 and a second housing 92 slidably arranged on the first housing 91 along the first direction X, the first housing 91 and the second housing 92 are enclosed to form a receiving structure 991 with an opening 992. The retractable screen structure is arranged in the receiving structure 991, the rotating shaft assembly 12 is located at a side close to the second housing 92, a first end 901 of the flexible display screen 90 is located at a side close to the bottom of the housing, and a second end 902 of the flexible display screen 90 is connected to the first housing 91 to cover the opening 992. The driving mechanism 99 is arranged in the receiving structure 991. The driving mechanism 99 is connected to the sliding rail mechanism 1 and configured to drive the sliding rail mechanism 1 to move along the first direction X. Optionally, the first housing 91 may be provided with a support plate 93, the second end of the flexible display screen 90 is connected to the support plate 93, and the support plate 93 can support and protect the flexible display screen 90.

The driving mechanism 99 includes a frame body 30, as well as a driving assembly and a transmission assembly mounted on the frame body 30. The frame body 30 may be provided with a mounting member 302 to be connected with a middle frame of the electronic device 100, and the mounting member 302 is fixed to the middle frame by a fastener, such that the driving mechanism 99 is mounted on the middle frame. Optionally, the number of driving mechanisms 99 can be set according to actual needs. In an example illustrated in FIG. 20, two driving mechanisms 99 are provided and symmetrically arranged on the first housing 91; in this way, the sliding rail mechanism 1 can be driven to move more stably such that the two sides of the sliding rail mechanism 1 are stressed evenly and the sliding rail mechanism 1 can move more stably.

The driving assembly includes a driving member 31 and a reduction gearbox structure 32 connected to the driving member 31, and both the driving member 31 and the reduction gearbox structure 32 are mounted on the frame body 30. Optionally, the driving member 31 may be a driving motor or an electric motor.

The transmission assembly includes a first transmission member 14 and a second transmission member 15 movably connected to the first transmission member 14. The first transmission member 14 is mounted on the frame body 30 and connected to the reduction gearbox structure 32. The second transmission member 15 is configured to be drivingly connected with the flexible display screen of the retractable screen structure.

The driving member 31 outputs a first torque to the reduction gearbox structure 32, and the reduction gearbox structure 32 converts the first torque into a second torque and outputs the second torque to the first transmission member 14 to drive the first transmission member 14 to rotate, and the second transmission member 15 moves relative to the first transmission member 14 to drive the flexible display screen to move. The first torque is less than the second torque. It is understood that the driving mechanism drives the sliding rail mechanism 1 to move along the first direction X and then the second housing 92, the sliding rail assembly 20, the first end of the flexible display screen 90, and the sliding member 22 are driven to move along the first direction X relative to the first housing 91, such that the flexible display screen 90 is switched between the expanded state and the retracted state.

Based on the above arrangement, the driving mechanism 99 converts the first torque output by the driving member into a higher second torque through the reduction gearbox structure, and then transmits the second torque to the first transmission member and the first transmission member is then rotated, thereby driving the flexible display screen to move. In this way, the low torque of the driving member can be converted into a high torque to drive the first transmission member to rotate, to better drive the flexible display screen to move.

In some possible implementations, the driving assembly may further include a control circuit board 312 connected to the driving member 31 and configured to control the driving member 31 according to an instruction. The control circuit board 312 may be a FPC (Flexible Printed Circuit) board. The control circuit board 312 is communicated with a terminal main board of the electronic device 100. When the flexible display screen needs to be expanded, the terminal main board transmits a command "expand" to the control circuit board 312. The control circuit board 312 controls the driving motor to rotate, and the driving motor amplifies the torque of the driving motor through the reduction gearbox structure 32 and drives the second transmission member 15 to move linearly relative to the first transmission member 14. The second transmission member 15 drives the flexible display screen to stretch outward, thus completing the expanding action of the flexible display screen. When the flexible display screen needs to retract, a user can tap on the display screen of the electronic device 100 to send a command "retract" to the terminal main board. The terminal main board transmits the command "retract" to the control circuit board 312, and the control circuit board 312 then controls the driving motor to rotate in a direction opposite to the direction of expanding rotation. The driving motor amplifies the torque of the driving motor through the reduction gearbox structure 32 and drives the second transmission member 15 to move linearly relative to the first transmission member 14. The second transmission member 15 drives the flexible display screen to retract to an initial position. In the present embodiment, the control circuit board 312 is connected to the driving motor by welding, and the control circuit board 312 is communicated with the terminal main board, or communicated with the main board terminal through a BTB connector to realize that the driving motor is powered, and the driving motor is controlled to rotate by the control signal.

In some possible implementations, the driving motor may be configured as a DC stepper motor which is an open-loop control motor that converts an electric pulse signal into an angular displacement or a linear displacement. In the case of non-overload, the speed and stop position of the motor only depend on the frequency and pulse number of the pulse signal, and are not affected by load changes. When receiving a pulse signal, the stepper driver drives the stepper motor to rotate by a fixed angle in a set direction. The stepper motor rotates step by step at a fixed angle. The angular displacement can be controlled by controlling the pulse number, to achieve the purpose of accurate positioning. In the meanwhile, the rotation speed and acceleration of the motor can be controlled by controlling the pulse frequency, to achieve the purpose of speed regulation and rotating torque input.

The first transmission member 14 is configured as a screw rod, the second transmission member 15 is configured as a nut threaded with the screw rod, and two ends of the screw rod are connected to the frame body 30 through bearings 141. The bracket 11 of the retractable screen structure is provided with a transmission member 13. The screw rod extends along the first direction X, and the nut abuts against the transmission member 13. The driving motor drives the screw rod to rotate, and then the nut and the transmission member are driven to move along the first direction X, thereby driving the sliding rail mechanism 1 to move along the first direction X. It should be noted that the first transmission member and the second transmission member may also adopt structures such as gear racks, worm gears, and the like, which is not limited in the present disclosure.

In some possible implementations, the driving mechanism 99 further includes a guide rod 33 arranged on the frame body 30, and the guide rod 33 is arranged in parallel with the screw rod. The nut includes a first fitting part 151 and a second fitting part 152, the first fitting part 151 is threaded with the screw rod, and the second fitting part 152 is fitted over the guide rod 33. The second transmission member 15 is further provided with a protrusion 153 for abutting against the transmission member 13 of the bracket 11 of the retractable screen structure. It can be understood that the nut is threaded with the screw rod through the first fitting part 151, and when the screw rod rotates, the nut linearly moves relative to the screw rod. During the movement, the second fitting part 152 moves along the guide rod 33 to guide the nut.

In some possible implementations, the driving member 31 includes an output shaft 311, and the reduction gearbox structure 32 includes a first reduction gearbox and a second reduction gearbox. The first reduction gearbox includes a first gear 321, the second reduction gearbox includes a second gear 322 and a third gear 323 (which can be understood as a screw rod gear) mating with the second gear 322, the third gear 323 is connected with the first transmission member 14, the second gear 322 mates with the first gear 321, and the first gear 321 is connected with the output shaft 311. The output shaft 311 outputs a first torque to the first gear 321, and the first torque is converted into a second torque by the second gear 322 and the third gear 323 and output to the first transmission member 14. Through the gear mating of the first gear 321, the second gear 322, and the third gear 323, the low torque output by the driving motor can be converted into a high torque.

In some possible implementations, the reduction gearbox structure 32 further includes a reduction gearbox end cover 34 fixedly connected to a side of the frame body 30. Optionally, a side frame 301 configured to be fixedly connected with the reduction gearbox end cover 34 is arranged on a side of the frame body 30, and the reduction gearbox end cover 34 is fixed to the side frame 301. The gearbox end cover 34 is fixed to the side frame 301 by a plurality of fasteners 342 (e.g., screws). The first gear 321 and the second gear 322 are both connected to the reduction gearbox end cover 34, the third gear 323 is connected to the reduction gearbox end cover 34 through the first transmission member 14, and the reduction gearbox end cover 34 functions to fix the first gear 321, the second gear 322, the third gear 323 and the first transmission member 14.

In some possible implementations, the first reduction gearbox includes a first bushing 324 fixed to the reduction gearbox end cover 34, and the first gear 321 is mounted on the first bushing 324. Optionally, the reduction gearbox end cover 34 is provided with a first through hole 341, the first bushing 324 is fixed to the first through hole 341, and the first gear 321 is a sun gear and mounted on the first bushing 324. The second reduction gearbox includes a limit post 35 fixed to the reduction gearbox end cover 34, the second gear 322 is mounted on the limit post 35, and the limit post 35 functions to limit and fix the second gear 322.

In some possible implementations, the first transmission member 14 is configured as a screw rod, an end of the screw rod is connected to the reduction gearbox end cover 34 through the bearing 141, and the third gear 323 mates with the screw rod. Optionally, the reduction gearbox end cover 34 is further provided with a second through hole 343, the bearing 141 is mounted in the second through hole 343, and an end of the screw rod is mounted on the bearing 141 to be fixed to the frame body 30.

In some possible implementations, the first reduction gearbox further includes: a fixed gear ring 36, a driving gear 37, a planetary gear carrier 38 and a planetary gear 39.

The fixed gear ring 36 is connected to the driving member 31, and the output shaft 311 extends into the fixed gear ring 36.

The driving gear 37 is mounted in the fixed gear ring 36 and fixed to the output shaft 311. Optionally, the first reduction gearbox further includes a second bushing 371, and the driving gear 37 is mounted on the second bushing 371 to protect and limit the driving gear 37.

The planetary gear carrier 38 is mounted in the fixed gear ring 36 and is mated with and fixed to the first gear 321. Optionally, the first reduction gearbox further includes a third bushing 381, and the planetary gear carrier 38 is mounted on the third bushing 381 to protect and limit the planetary gear carrier 38.

The planetary gear 39 is mounted on the planetary gear carrier 38 and mates with the driving gear 37.

The output shaft 311 outputs a first torque to the driving gear 37, and the first torque is reduced by the driving gear 37, the planetary gear 39, and the planetary gear carrier 38 and then transmitted to the first gear 321, achieving a first-stage reduction effect. Then, the torque is reduced by the first gear 321 and then transmitted to the second gear 322, achieving a second-stage reduction effect. Then, the torque is reduced by the second gear 322 and then converted to the second torque and the second torque is transmitted to the third gear 323, achieving a third-stage reduction effect. The third gear 323 transmits the second torque to the first transmission member 14 to drive the first transmission member 14 to rotate.

Based on the above arrangement, a first-stage reduction gearbox is formed by the gear mating of the driving gear 37, the planetary gear carrier 38 and the planetary gear 39. Through the gear mating of the first gear 321, the second gear 322 and the third gear 323, second- and third-stage reduction gearboxes are formed. The planetary gear 39 can function as a first-stage reduction gear, the first gear 321 can function as a second reduction gear, the second gear 322 can function as a third reduction gear, and the third gear 323 can function as a screw rod gear.

It can be understood that the first reduction gearbox is a core component of the driving mechanism. An end of the first reduction gearbox is mounted on and welded to the driving motor, and the other end of the first reduction gearbox is fixed to the frame body 30 by welding. The first reduction gearbox includes an output shaft 311 of the driving motor, the driving gear 37, the second bushing 371, the planetary gear 39, the planetary gear carrier 38, the third bushing 381, the fixed gear ring 36, and the first gear 321. All parts are fixed by gear mating; the output shaft 311, the driving gear 37, the second bushing 371, the planetary gear 39, the planetary gear carrier 38, the third bushing 381 and the first gear 321 are all fixedly fitted inside the fixed gear ring; the driving gear 37 is fixed to the output shaft 311 of the driving motor, and the planetary gear carrier 38 and the first gear 321 mate with each other and are fixed. The other end of the first gear 321 is fixed to the first bushing 324, and is fixed to the reduction gearbox end cover 34 through the first bushing 324. The second gear 322 is fixed to the frame body 30 and the reduction gearbox end cover 34 through the limit post 35. The third gear 323 is fixed to the first transmission member 14, an end of the first transmission member 14 is fixed to the frame body 30 through a bearing 141, and the other end of the first transmission member 14 is also fixed to the reduction gearbox end cover 34 through a bearing 141. The reduction gearbox end cover 34 is fixed to the frame body 30 by a fastener 342, and the three gears (the first gear 321, the second gear 322 and the third gear 323) form second- and third-stage reduction gearboxes by gear mating. The torque output by the driving motor is reduced by the first reduction gearbox and the second reduction gearbox, and then a torque that is several or several tens of times greater than the output torque is output to the screw rod to drive the screw rod to rotate. The screw rod drives the nut to move. The reduction gearbox structure mainly functions to convert the low torque output by the driving motor into a high torque.

In some alternative implementations, the frame body 30 may be manufactured by MIM (Metal Injection Modeling), and the aperture and part dimensions need to be processed by a lathe or a CNC machining center. The frame body 30 mainly functions to fix the reduction gearbox structure, the screw rods, the nut, the bearing, the guide rod and other components. Therefore, the precision requirement and the flatness requirement for the frame body 30 are both relatively high. The precision of the frame body 30 directly affects the stability of the entire driving mechanism. The entire frame body 30 can be fixed to the first housing 91 of the middle frame of the electronic device 100.

The nut can be made by MIM and plastic double-shot molding, and the plastic employs engineering plastic (POM material is commonly used), which has a self-lubricating effect. A side of the nut is fixed to the guide rod, and another end of the nut is fixed to the screw rod and a screw rod guide groove needs to be designed at the end fixed to the screw rod, to drive the nut to move linearly. According to the structural requirements of the push-out assembly, a bone position is designed on the nut such that the nut is connected and fixed to the side sliding member to push the sliding member to move. The guide rod can be made of stainless steel. The guide rod requires relatively high surface roughness and functions to guide and fix the nut. The screw rod is generally made of high-strength tool steel and is machined many times through a lathe or a machining center. Bearings are fixed at two ends of the screw rod, an end of the screw rod is fixed to the frame body, and the other end of the screw rod is fixed to the reduction gearbox end cover. The driving motor drives the screw rod to rotate through the reduction gearbox structure, and the screw rod drives the nut to move linearly. Therefore, the strength and precision of the screw rod directly affect the stability and smoothness of the sliding member pushed by the nut.

Figure 14:
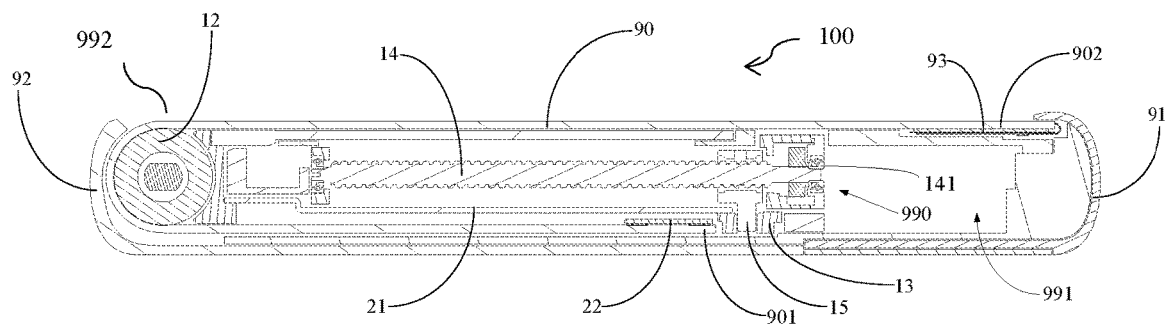
FIGS. 14 and 15 are schematic diagrams of an electronic device according to an embodiment of the present disclosure when a flexible display screen is in a retracted state and an expanded state, respectively.

Referring again to FIGS. 14 to 16, due to the pre-tension of the elastic member of the elastic assembly, the sliding member 22 is pre-tensioned by the elastic assembly at the initial position, and due to the existence of the limit stopper 25, the sliding member 22 is kept at the initial position in a static state and the flexible display screen 90 is in a retracted state.

Figure 15:
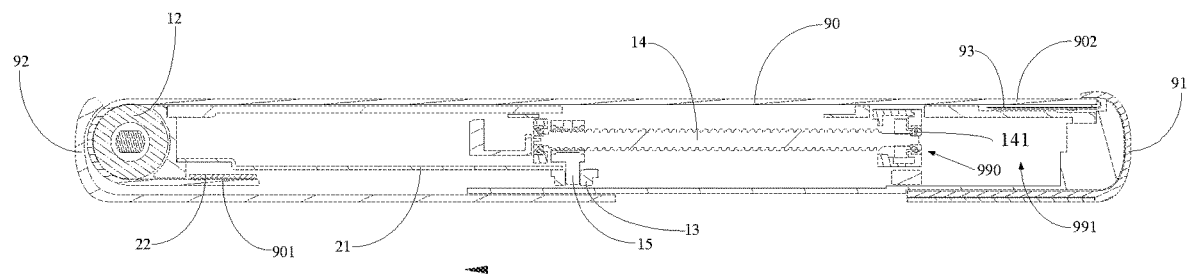
Figure 16:
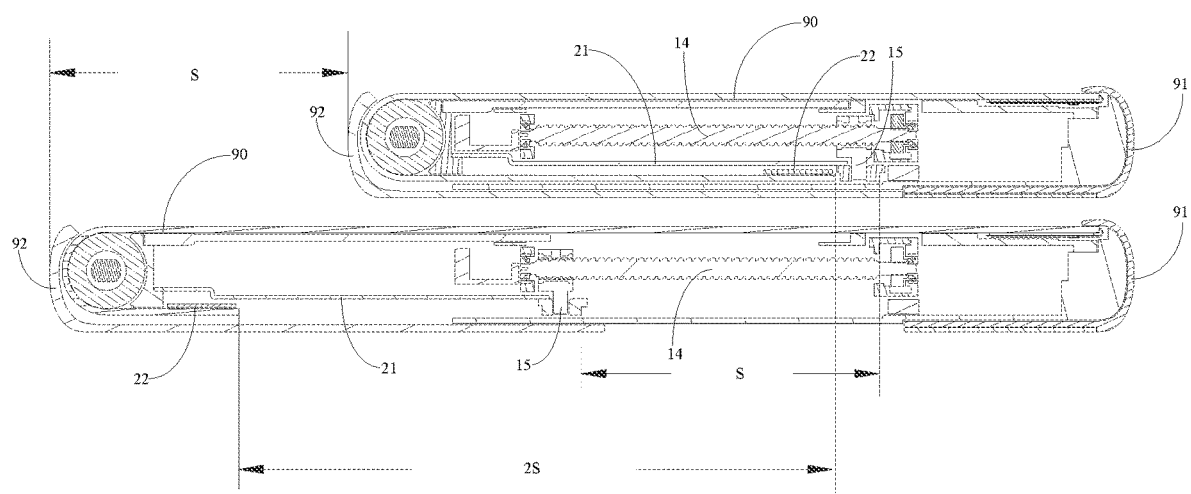
FIG. 16 shows comparison diagrams of an electronic device according to an embodiment of the present disclosure when a flexible display screen is in a retracted state and an expanded state, respectively.
Figure 17:
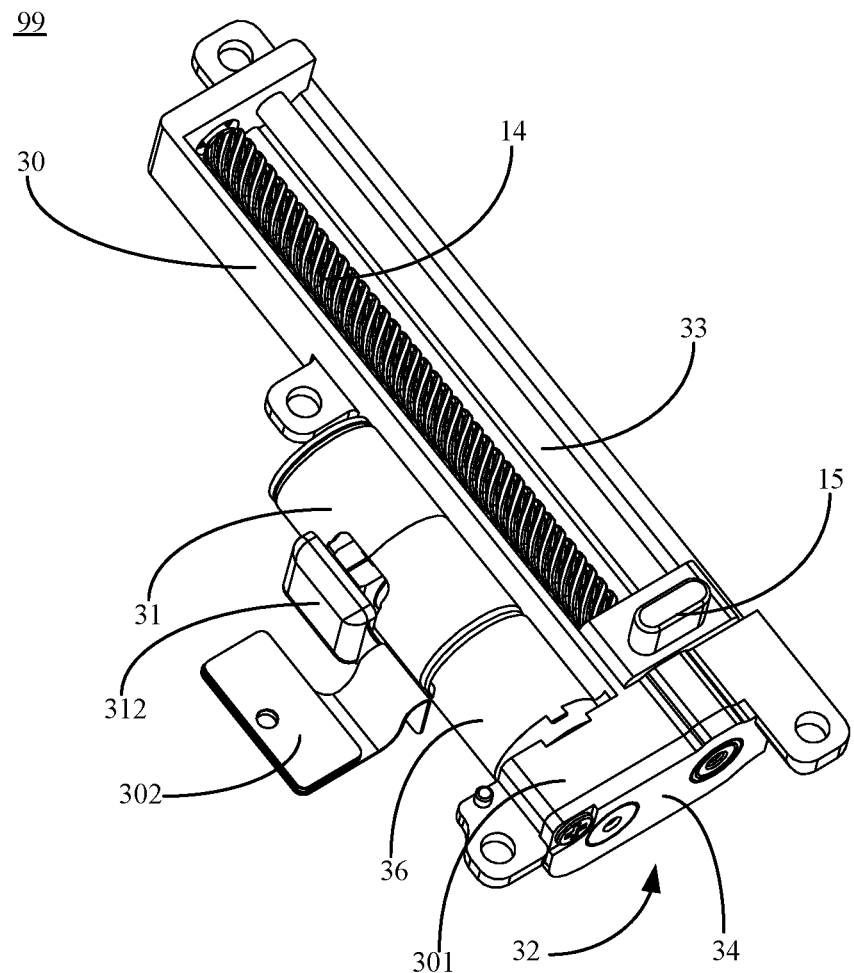
FIG. 17 is a schematic perspective diagram of a driving mechanism of an electronic device according to an embodiment of the present disclosure.
Figure 18:
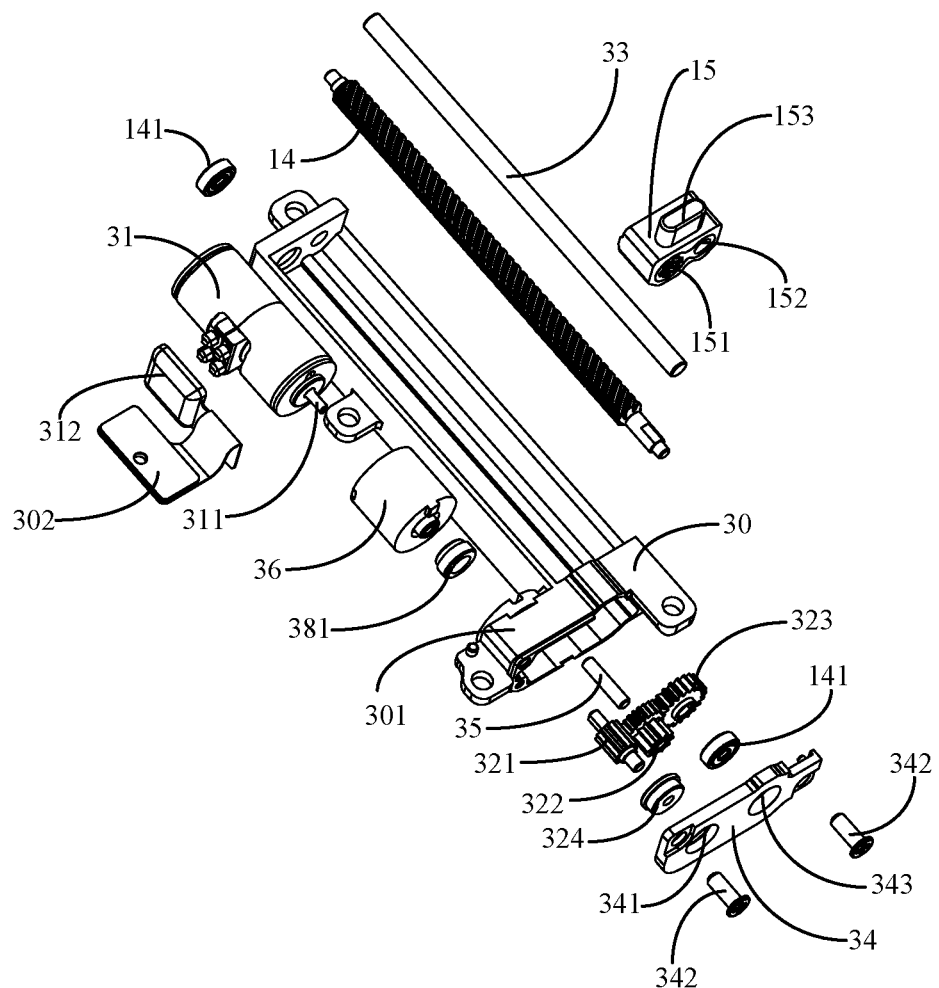
FIG. 18 is a schematic exploded diagram of a driving mechanism of an electronic device according to an embodiment of the present disclosure.
Figure 19:
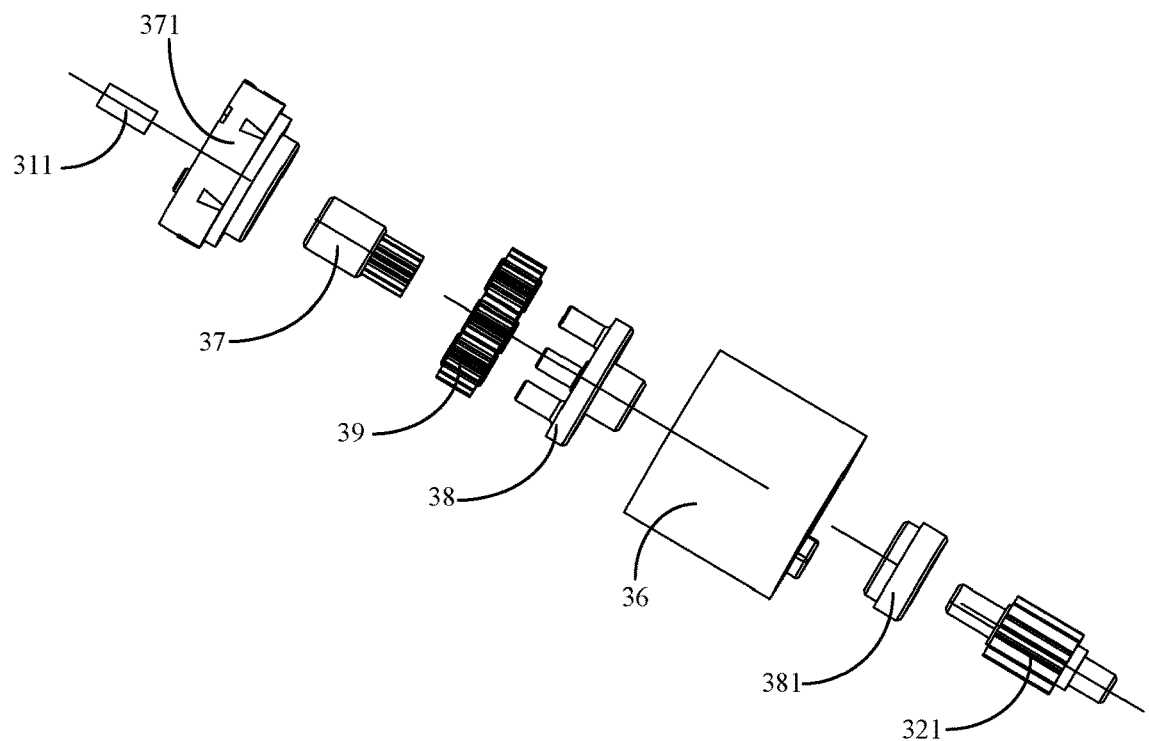
FIG. 19 is a schematic exploded diagram of a first reduction gearbox of a driving mechanism of an electronic device according to an embodiment of the present disclosure.
Figure 20:
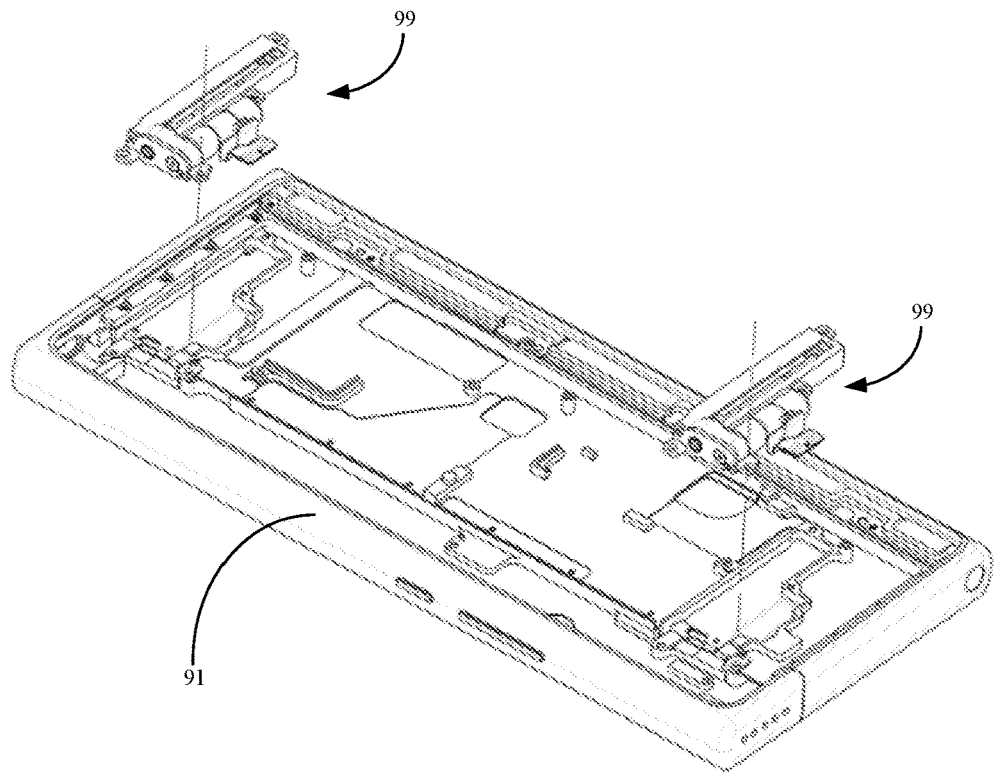
FIG. 20 is a schematic diagram showing mounting positions of driving mechanisms of an electronic device according to an embodiment of the present disclosure.
Figure 21:
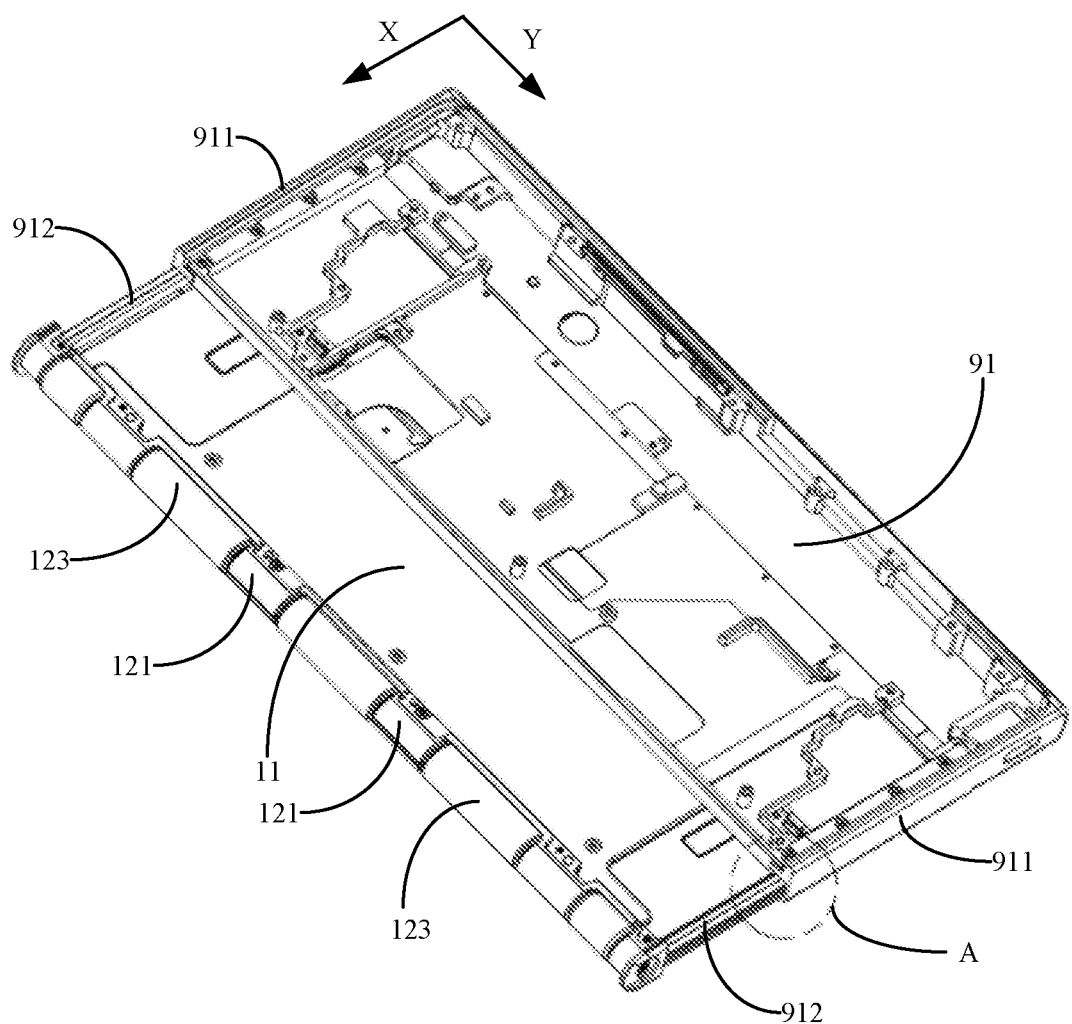
FIG. 21 is a schematic structural diagram showing a sliding rail mechanism and a part of a housing of an electronic device according to an embodiment of the present disclosure.
Figure 22:
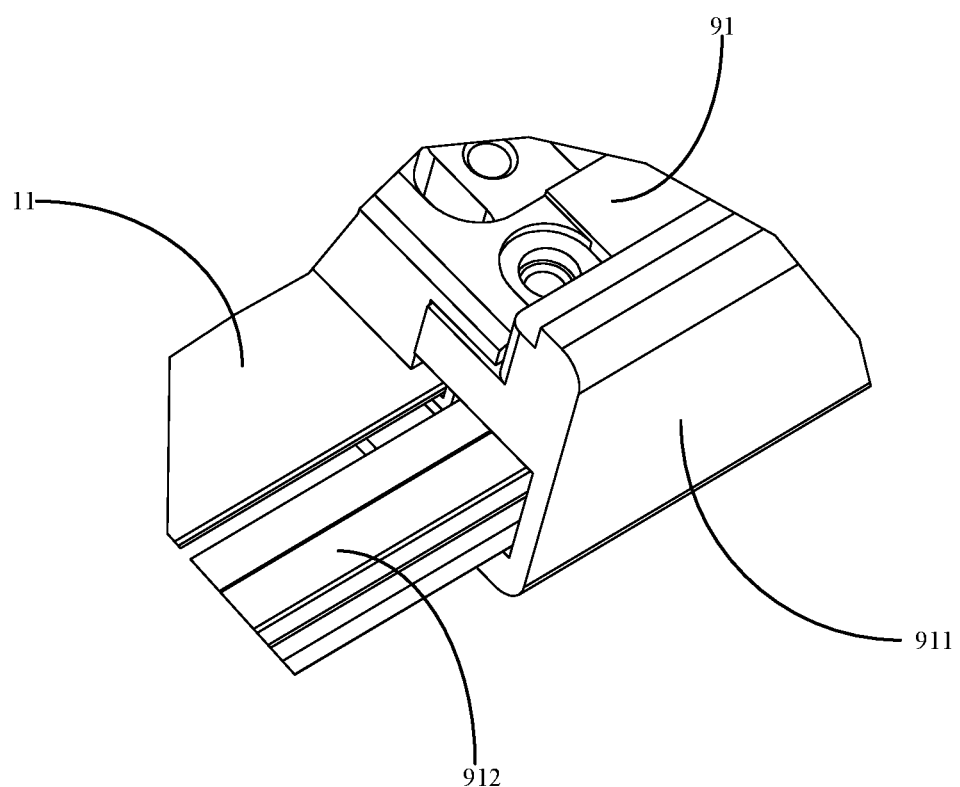
FIG. 22 is a schematic enlarged diagram of position A in FIG. 21.
Figure 23:
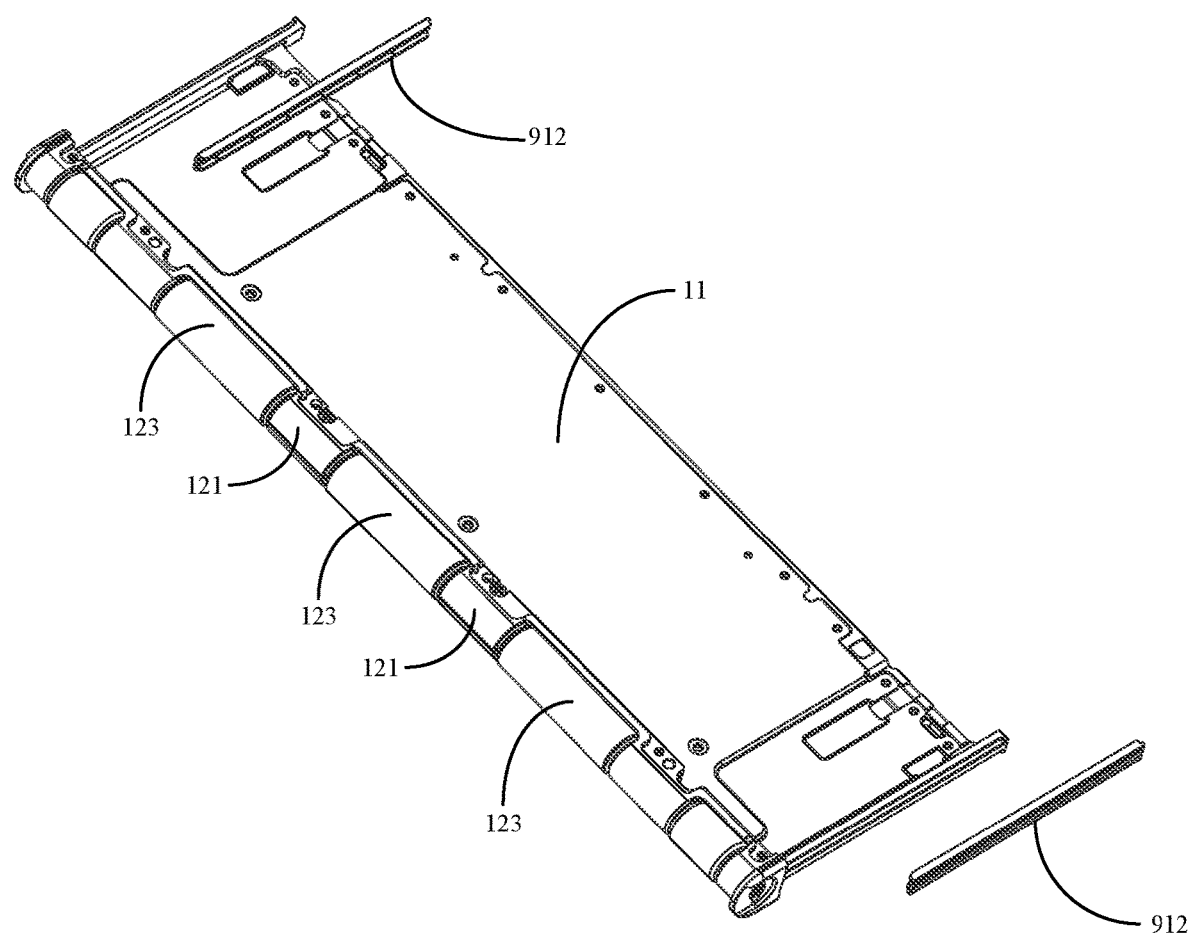
FIG. 23 is a schematic structural diagram of a bracket of a sliding rail mechanism of an electronic device according to an embodiment of the present disclosure.
Figure 24:
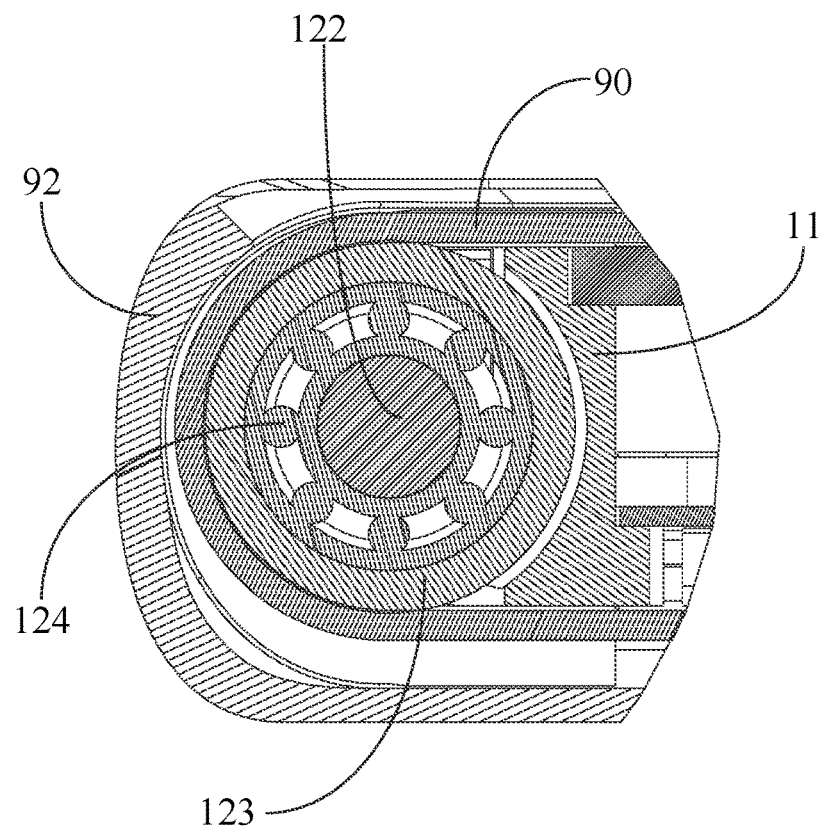
FIG. 24 is a schematic enlarged partial diagram of a rotating shaft assembly part in FIG. 14.
Figure 25:
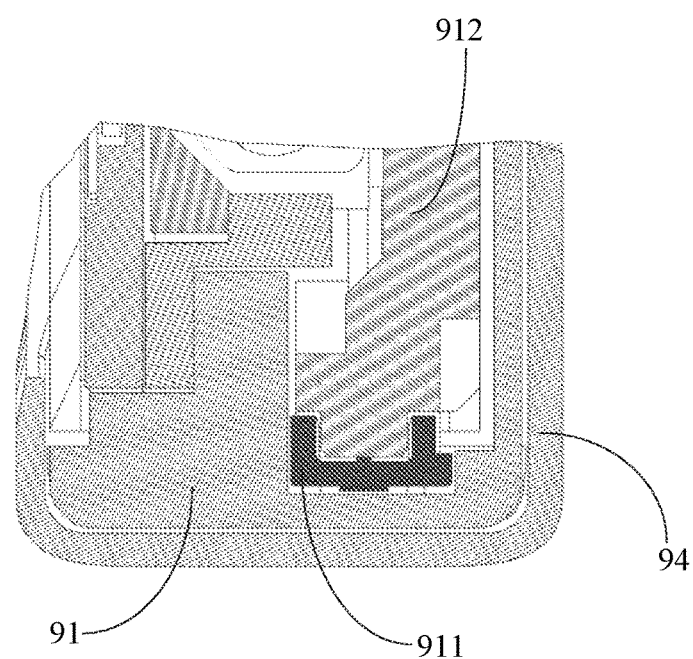
FIG. 25 is a cross-sectional view of FIG. 22.

As the power source, the driving mechanism is fixed to the middle frame (i.e., the housing) of the whole device. After receiving an instruction through a UI, the electronic device 100 controls the driving mechanism to drive the sliding rail mechanism 1 to move along the first direction X (to the left as illustrated in FIG. 15) such that the whole sliding rail mechanism 1 slides out relative to the first housing 91 in a direction away from the first housing 91. In this process, the first end of the flexible display screen 90 slides together with the sliding member 22, and the rotating wheel of the rotating shaft assembly is passively rotated by the force of the flexible display screen 90; because the second end of the flexible display screen 90 is connected with the first housing 91, as the sliding rail mechanism 1 gradually slides out, an effect of gradually expanding the flexible display screen 90 can be achieved, as illustrated in FIG. 15. In the sliding process of the sliding rail mechanism 1, the sliding member 22 can be pulled by the flexible display screen to move from an end of the fixed base 21 to the other end, which can further extend the expanding length of the flexible display screen 90. In addition, in the sliding process, the elastic assembly is pulled by the sliding member 22 to generate on the sliding member 22 an elastic tension in a direction opposite to the sliding direction. The flexible display screen 90 is always subjected to the tension in the opposite direction, which is equivalent to pulling the flexible display screen 90 to the right, such that the flexible display screen 90 stretched out becomes flatter. In this way, it is ensured that the flexible display screen 90 can move along a curving track according to the design intent, thereby preventing the visual problems such as bulging, swelling and distortion of the screen when the whole device is slid open.

It can be understood that in the whole process, the sliding member 22 is pulled by the second end of the flexible display screen 90 to move from one end of the fixing base 21 to the other end. Assuming that the sliding stroke of the sliding rail mechanism 1 relative to the first housing 91 is S and the sliding stroke of the sliding member 22 is S, the first end of the flexible display screen 90 moves a distance of 2S relative to the first housing 91 along with the sliding rail mechanism 1.

When the whole device retracts after receiving an external instruction, the drive motor starts to provide a drive in the reverse direction to retract the sliding rail mechanism 1 and the flexible display screen. In this process, the bracket and the fixed base are driven by the driving mechanism to move in the reverse direction. The flexible display screen and the sliding member are gradually retracted under the elastic force of the elastic assembly, and the sliding member returns to the initial position under the elastic force of the elastic assembly, thereby restoring the flexible display screen to the retracted state. Therefore, the use of the sliding rail mechanism 1 of the present disclosure can smoothly and effectively ensure that the flexible display screen maintains the curved shape in appearance during the sliding-open and retracting of the whole device, and ensure that the power loss caused by the friction generated during the sliding-open and retracting of the screen is at a relatively low level; this solution is operable and easy to implement and the product reliability can be ensured.

Referring to FIGS. 21 to 25, in some optional embodiments, the housing includes a first housing 91 and a second housing 92 slidably arranged on the first housing 91 along the first direction X, the first housing 91 and the second housing 92 are enclosed to form a receiving structure 991 with an opening 992. The first housing 91 is provided with a first sliding portion 911 arranged along the first direction X. A first end 901 of the flexible display screen 90 is located at a side close to the bottom of the housing, and a second end 902 of the flexible display screen 90 is connected to the first housing 91 to cover the opening 992. In the present embodiment, the opening 992 is located at the top of the housing. Optionally, decorative members 94 may be arranged on the outer sides of the first housing 91 and the second housing 92 to take a protective and decorative effect.

The sliding rail mechanism 1 includes a bracket 11 connected to the first end 901 of the flexible display screen 90, and the bracket 11 is provided with a second sliding portion 912 matching the first sliding portion 911. The first sliding portion 911 is one of a sliding rail or a sliding groove, and the second sliding portion 912 is the other of the sliding rail and the sliding groove. The sliding rail moves along the sliding groove, such that the sliding rail mechanism 1 drives the flexible display screen 90 to slide along the first direction X relative to the first housing 91, thus realizing the expanding and retracting of the flexible display screen. Optionally, the first sliding portion 911 and the first housing of the middle frame housing are integrally formed, which is convenient for production and processing. In the examples illustrated in FIGS. 21 to 23, the first sliding portion 911 is a sliding groove, and the second sliding portion 912 is a sliding rail. Two sides of the first housing 91 are each provided with the first sliding portion 911 along the second direction (direction Y in FIG. 21) perpendicular to the first direction X (direction X in FIG. 21). Two sides of the bracket 11 along the second direction are each provided with the second sliding portion 912. By arranging two sets of the first sliding portions 911 and the second sliding portions 912, the sliding rail mechanism 1 can move more stably relative to the first housing 91, and the stability of the whole device can be improved.

Figure 26:
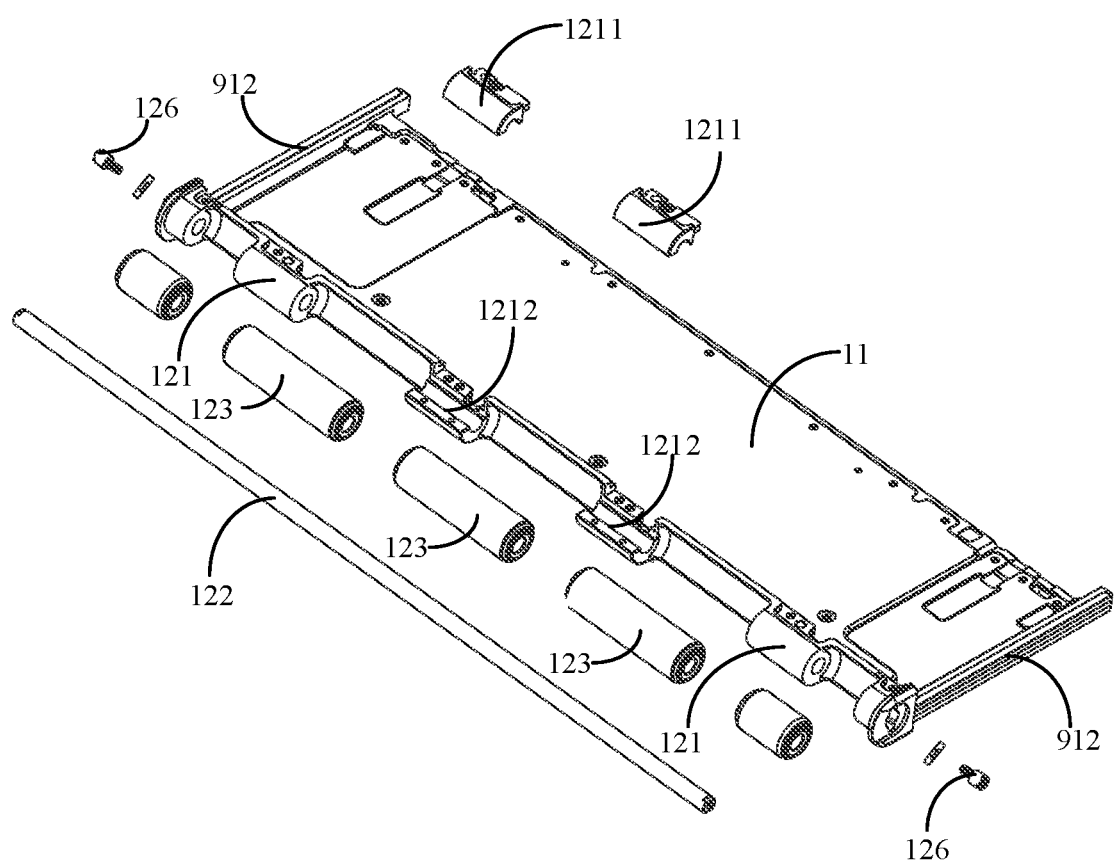
FIG. 26 is a schematic structural diagram of a sliding rail mechanism of an electronic device according to another embodiment of the present disclosure.

Referring to FIG. 26, in some optional embodiments, the sub-support 121 includes a first hoop base 1211 and a second hoop base 1212 spliced with the first hoop base 1211, the first hoop base 1211 and the second hoop base 1212 hoop on the two sides of the rotating shaft 122 and are connected to each other, and any one of the first hoop base 1211 and the second hoop base 1212 is fixedly connected to the bracket 11; in the example illustrated in the figure, the second hoop base 1212 is fixedly connected to the bracket 11. The sub-support 121 adopts a detachable structure in which the first hoop base 1211 and the second hoop base 1212 are spliced with each other, which is convenient for disassembly and mounting.

Those skilled in the art will readily conceive of other implementation solutions of the present disclosure after considering the description and practicing the application disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are pointed out by the appended claims.

It should be understood that the present disclosure is not limited to the precise structure that has been described above and illustrated in the drawings, and various modifications and changes can be made without departing from the scope of the present disclosure. The scope of the present disclosure is only limited by the appended claims.

What is claimed is:

1. An electronic device, comprising:
a first housing and a second housing slidably arranged on the first housing along a first direction, the first housing and the second housing being enclosed to form a receiving structure with an opening, the first housing being provided with a first sliding portion arranged along the first direction;
a flexible display screen having a first end arranged at a side close to a bottom of the housing and a second end connected to the first housing to cover the opening; and
a sliding rail mechanism comprising a bracket connected to the flexible display screen, the bracket being provided with a second sliding portion matching the first sliding portion, the first sliding portion being one of a sliding rail and a sliding groove, the second sliding portion being the other of the sliding rail and the sliding groove; the sliding rail moving along the sliding groove such that the sliding rail mechanism drives the flexible display screen to slide along the first direction relative to the first housing,
wherein the sliding rail mechanism further comprises a sliding rail assembly, and the sliding rail assembly comprises a fixed base, a sliding member, and an elastic assembly; the fixed base is fixedly connected to the bracket, the sliding member is slidably arranged on the fixed base along the first direction, the elastic assembly has a first end connected to the fixed base and a second end connected to the sliding member; when the sliding member slides along the first direction relative to the fixed base, the second end of the elastic assembly and the flexible display screen are driven to move together.

2. The electronic device according to claim 1, wherein the first sliding portion is a sliding groove and the second sliding portion is a sliding rail, two sides of the first housing along a second direction perpendicular to the first direction are each provided with the first sliding portion, and two sides of the bracket along the second direction are each provided with the second sliding portion.

3. The electronic device according to claim 1, further comprising a driving mechanism arranged in the receiving structure and fixedly connected to the first housing, the driving mechanism being connected to the bracket and configured to drive the bracket to move along the first direction;
wherein the driving mechanism drives the bracket to move along the first direction, and the second housing and the first end of the flexible display screen are driven to move along the first direction relative to the first housing such that the flexible display screen is switched between a retracted state and an expanded state.

4. The electronic device according to claim 3, wherein two driving mechanisms are provided and symmetrically arranged on the first housing.

5. The electronic device according to claim 3, wherein the driving mechanism comprises a driving motor, a screw rod connected to the driving motor, and a nut fitted over the screw rod, the screw rod extends along the first direction, and the nut abuts against the bracket; and the driving motor drives the screw rod to rotate, and the nut and the bracket are driven to move along the first direction, to drive the sliding rail mechanism to move along the first direction.

6. The electronic device according to claim 3, wherein the driving mechanism comprises a frame body, and a driving assembly and a transmission assembly mounted on the frame body;

the driving assembly comprises a driving member and a reduction gearbox structure connected to the driving member, and both the driving member and the reduction gearbox structure are mounted on the frame body; and the transmission assembly comprises a first transmission member and a second transmission member movably connected to the first transmission member, the first transmission member is mounted on the frame body and connected to the reduction gearbox structure, the second transmission member is configured to be drivingly connected with the flexible display screen.

7. The electronic device according to claim 6, wherein the driving assembly further comprises a control circuit board connected to the driving member and configured to control the driving member according to an instruction.

8. The electronic device according to claim 6, wherein the first transmission member is configured as a screw rod, the second transmission member is configured as a nut threaded with the screw rod; the screw rod extends along the first direction and has two ends connected to the frame body through bearings; the bracket is provided with a transmission member, and the nut abuts against the transmission member of the bracket.

9. The electronic device according to claim 8, wherein the driving mechanism further comprises a guide rod arranged on the frame body and in parallel with the screw rod, and the nut comprises a first fitting part threaded with the screw rod and a second fitting part fitted over the guide rod.

10. The electronic device according to claim 8, wherein the second transmission member is provided with a protrusion for abutting against the transmission member of the bracket.

11. The electronic device according to claim 6, wherein the driving member comprises an output shaft, and the reduction gearbox structure comprises a first reduction gearbox and a second reduction gearbox; the first reduction gearbox comprises a first gear connected with the output shaft, the second reduction gearbox comprises a second gear mating with the first gear and a third gear mating with the second gear and connected with the first transmission member.

12. The electronic device according to claim 11, wherein the reduction gearbox structure further comprises a reduction gearbox end cover fixedly connected to a side of the frame body.

13. The electronic device according to claim 12, wherein a side frame is arranged on the side of the frame body, and the reduction gearbox end cover is fixed to the side frame.

14. The electronic device according to claim 12, wherein the first reduction gearbox comprises a first bushing fixed to the reduction gearbox end cover, and the first gear is mounted on the first bushing.

15. The electronic device according to claim 12, wherein the first reduction gearbox further comprises a fixed gear ring connected to the driving member, a driving gear mounted in the fixed gear ring and fixed to the output shaft, a planetary gear carrier mounted in the fixed gear ring and fixed to the first gear, and a planetary gear mounted on the planetary gear carrier and mating with the driving gear; the output shaft extends into the fixed gear ring.

16. The electronic device according to claim 1, further comprising a rotating shaft assembly, the rotating shaft assembly comprising a rotating shaft support, a rotating shaft, and a rotating wheel, the rotating shaft support being connected to a side of the bracket, the rotating shaft support being provided with a shaft hole, the rotating shaft passing through the shaft hole, the rotating wheel being fitted over the rotating shaft, wherein the flexible display screen is wound around the rotating wheel, the rotating wheel is driven to rotate when the flexible display screen is expanded or retracted.

17. The electronic device according to claim 16, wherein the rotating shaft support comprises a plurality of sub-supports arranged on the bracket and spaced apart; each sub-support is provided with a sub shaft hole; the sub shaft holes of the plurality of sub-supports are coaxially arranged to form the shaft hole, and the rotating shaft passes through the plurality of sub shaft holes;

the rotating wheel comprises a plurality of sub rotating wheels, and a sub rotating wheel is arranged between two adjacent sub-supports.

18. The electronic device according to claim 17, wherein the sub-support comprises a first hoop base and a second hoop base spliced with the first hoop base, the first hoop base and the second hoop base hoop on two sides of the rotating shaft and are connected to each other.

19. The electronic device according to claim 16, wherein the rotating shaft assembly further comprises two sets of first fasteners, the rotating shaft has a first end fixedly connected to the rotating shaft support through one set of the first fasteners and a second end fixedly connected to the rotating shaft support through the other set of the first fasteners.

20. An electronic device, comprising:

a first housing and a second housing slidably arranged on the first housing along a first direction, the first housing and the second housing being enclosed to form a receiving structure with an opening, the first housing being provided with a first sliding portion arranged along the first direction;

a flexible display screen having a first end arranged at a side close to a bottom of the housing and a second end connected to the first housing to cover the opening;

a sliding rail mechanism comprising a bracket connected to the flexible display screen, the bracket being provided with a second sliding portion matching the first sliding portion, the first sliding portion being one of a sliding rail and a sliding groove, the second sliding portion being the other of the sliding rail and the sliding groove; the sliding rail moving along the sliding groove such that the sliding rail mechanism drives the flexible display screen to slide along the first direction relative to the first housing; and a rotating shaft assembly, the rotating shaft assembly comprising a rotating shaft support, a rotating shaft, and a rotating wheel, the rotating shaft support being connected to a side of the bracket, the rotating shaft support being provided with a shaft hole, the rotating shaft passing through the shaft hole, the rotating wheel being fitted over the rotating shaft, wherein the flexible display screen is wound around the rotating wheel, the rotating wheel is driven to rotate when the flexible display screen is expanded or retracted.

\* \* \* \* \*